United States Patent
Adams et al.

(10) Patent No.: US 9,541,462 B2
(45) Date of Patent: Jan. 10, 2017

(54) PRESSURE SENSOR INCLUDING DEFORMABLE PRESSURE VESSEL(S)

(71) Applicant: Kionix, Inc., Ithaca, NY (US)

(72) Inventors: Scott G. Adams, Ithaca, NY (US); Charles W. Blackmer, Ithaca, NY (US); Kristin J. Lynch, Ithaca, NY (US)

(73) Assignee: Kionix, Inc., Ithaca, NY (US)

( * ) Notice: Subject to any disclaimer, the term of this patent is extended or adjusted under 35 U.S.C. 154(b) by 101 days.

(21) Appl. No.: 14/474,059

(22) Filed: Aug. 29, 2014

(65) Prior Publication Data

US 2016/0061679 A1 Mar. 3, 2016

(51) Int. Cl.
| | | |
|---|---|---|
| *G01L 9/00* | (2006.01) | |
| *B81C 1/00* | (2006.01) | |
| *G01L 13/00* | (2006.01) | |
| *H01L 21/00* | (2006.01) | |

(52) U.S. Cl.
CPC ............... *G01L 9/0073* (2013.01); *B81C 1/00* (2013.01); *G01L 9/003* (2013.01); *G01L 9/008* (2013.01); *G01L 9/0027* (2013.01); *G01L 9/0055* (2013.01); *G01L 13/00* (2013.01); *H01L 21/00* (2013.01)

(58) Field of Classification Search
None
See application file for complete search history.

(56) References Cited

U.S. PATENT DOCUMENTS

| | | | |
|---|---|---|---|
| 5,501,893 A | 3/1996 | Laermer et al. | |
| 6,093,330 A | 7/2000 | Chong et al. | |
| 6,239,473 B1 | 5/2001 | Adams et al. | |
| 6,295,875 B1* | 10/2001 | Frick | G01L 9/0072 73/718 |
| 6,328,647 B1* | 12/2001 | Traudt | F24F 11/022 454/255 |
| 6,470,754 B1 | 10/2002 | Gianchandani | |
| 7,430,909 B2 | 10/2008 | Adams et al. | |
| 2006/0260411 A1 | 11/2006 | Fortin et al. | |
| 2006/0278007 A1* | 12/2006 | Harasyn | G01L 13/025 73/723 |
| 2007/0181962 A1 | 8/2007 | Partridge et al. | |

(Continued)

FOREIGN PATENT DOCUMENTS

EP 0775303 B1 5/1997

OTHER PUBLICATIONS

Chen, et al., "Unpowered Spiral-Tube Parylene Pressure Sensor for Intraocular Pressure Sensing", Sensors and Actuators A: Physical, Sep. 27, 2005, pp. 276-282, vol. 127, Issue 2, Elsevier, USA.

(Continued)

*Primary Examiner* — Andre Allen
(74) *Attorney, Agent, or Firm* — Wade IP Law LLC

(57) ABSTRACT

Techniques are described herein that perform pressure sensing using pressure sensor(s) that include deformable pressure vessel(s). A pressure vessel is an object that has a cross section that defines a void. A deformable pressure vessel is a pressure vessel that has at least one curved portion that is configured to structurally deform (e.g., bend, shear, elongate, etc.) based on a pressure difference between a cavity pressure in a cavity in which at least a portion of the pressure vessel is suspended and a vessel pressure in the pressure vessel.

27 Claims, 20 Drawing Sheets

(56) References Cited

U.S. PATENT DOCUMENTS

| | | | | |
|---|---|---|---|---|
| 2009/0000393 | A1* | 1/2009 | Nyfors | G01F 1/363 |
| | | | | 73/861.19 |
| 2010/0132472 | A1* | 6/2010 | Willcox | G01L 23/125 |
| | | | | 73/718 |
| 2012/0042714 | A1 | 2/2012 | Stamper | |
| 2012/0205752 | A1 | 8/2012 | Blackmer et al. | |
| 2013/0002530 | A1 | 1/2013 | Hung et al. | |
| 2013/0152694 | A1 | 6/2013 | Urvas et al. | |
| 2015/0276528 | A1* | 10/2015 | Willcox | G01L 9/0072 |
| | | | | 73/718 |
| 2015/0276532 | A1* | 10/2015 | Adams | G01L 9/0073 |
| | | | | 73/724 |
| 2016/0018274 | A1* | 1/2016 | Seitz | G01D 5/2417 |
| | | | | 73/862.626 |

OTHER PUBLICATIONS

Adams, et al., "A Single-Crystal Silicon Gyroscope with Decoupled Drive and Sense," Proc. SPIE vol. 3876, Micromachined Devices and Components V, Aug. 31, 1999, pp. 74-83, vol. 74, SPIE, USA.

Chen, et al., "In vivo Characterization of Implantable Unpowered Parylene MEMS Intraocular Pressure Sensors", The 10th Int'l Conf. on Miniaturized Systems for Chemistry and Life Sciences, Nov. 5-9, 2006, pp. 834-836, Society for Chemistry and Micro-Nano Systems, Tokyo, Japan.

Shaw, et al., "Scream I: a Single Mask, Single-Crystal Silicon, Reactive Ion Etching Process for Microelectromechanical Structures", Sensors and Actuators A: Physical, 1994, pp. 63-70, vol. 40, Issue 1, Elsevier, USA.

"Pressure Measurement" [online], Wikipedia [Retrieved on Aug. 28, 2014], Retrieved from the Internet: <URL: http://en.wikipedia.org/wiki/Pressure_measurement>, 16 pages.

Beebly, S. "MEMS Mechanical Sensors" [online], Norwood, MA, Artech House, Inc., 2004 [retrieved on Aug. 28, 2014], sections 6.2.3., 6.3, and first 2 pages of 6.4, Retrieved from the Internet: <URL: http://books.google.com/books?id=6wg5oXzks9UC&printsec=frontcover&dq=MEMS+mechanical+sensors&hl=en&sa=X&ei=fTkBVNvbNNLIgwSDzIHICg&ved=0CDIQ6AEwAA#v=onepage&q=MEMS%20mechanical%20sensors&f=false>, total: 7 pages.

"International Search Report & Written Opinion Issued in PCT Application No. PCT/US2015/047238", Mailed Date Jan. 11, 2016, 11 pages.

"International Preliminary Report on Patentability Issued in PCT Application No. PCT/US2015/047238", Mailed Date: Jul. 21, 2016, 4 pages.

* cited by examiner

PRESSURE SENSOR INCLUDING DEFORMABLE PRESSURE VESSEL(S)

BACKGROUND

1. Technical Field

The subject matter described herein relates to pressure sensors.

2. Background

Micromechanical devices commonly are used to create many types of sensors, including but not limited to pressure sensors, accelerometers, gyroscopes, and magnetometers. As time progresses, customers continue to demand a reduction in the size, cost, and current consumption of such sensors through a consolidation of the sensors into combination sensors. However, different fabrication processes often are used to fabricate different types of sensors. Using a different fabrication process for each type of sensor complicates the integration.

Conventional micromechanical pressure sensors typically are formed in electronic packages that have a membrane (a.k.a. diaphragm) extended over a cavity in a substrate, such that the membrane is coplanar with the substrate. A relative change of a pressure above the membrane with respect to a pressure below the membrane causes a net force that deforms the membrane. Capacitance-based principles can be used to detect a magnitude of the change, such that a greater capacitance corresponds to a greater magnitude.

For example, strain sensors may be incorporated into the membrane. The strain sensors may include a piezoelectric material that is formed from a silicon substrate of the pressure sensor from which the membrane may be made. In another example, an electrode may be placed in the cavity, and as the membrane moves closer to the electrode due to deformation of the membrane, the capacitance increases. In accordance with this example, when a voltage is applied between the membrane and the electrode, a difference between the charges on the membrane and the electrode is related to their separation.

In such conventional pressure sensors, supports for the membrane are attached to the surrounding electronic package. When the electronic package is attached to a circuit board, temperature and stress changes can be transmitted into the supports for the membrane and thereby create a false reading of the magnitude of the change. Moreover, it is well-known that piezoelectric materials are relatively sensitive to changes of temperature.

Calibration techniques sometimes may be used to remove inaccuracies of the reading that are based on the temperature and stress changes if the temperature and stress changes are due to tensions internal to the sensor, such as those arising from differing coefficient of thermal expansion (CTE) values among materials internal to the sensor. For instance, a reference sensing element may be used in combination with a primary sensing element so that a differential reading between the primary and reference sensing elements may be made. However, using such calibration techniques may consume a substantial amount of area on the substrate, increase cost of the sensor, and/or not adequately remove the inaccuracies. Furthermore, compensation for stress changes that are not internal to the sensor may not be possible.

Macroscopic pressure sensors are frequently based on the deformation of a Bourdon tube that is mechanically linked to a dial gauge.

SUMMARY

Various approaches are described herein for, among other things, performing pressure sensor techniques using pressure sensor(s) that include deformable pressure vessel(s). A pressure vessel is an object that has a cross section that defines a void. A deformable pressure vessel is a pressure vessel that has at least one curved portion that is configured to structurally deform (e.g., bend, shear, elongate, etc.) based on a pressure difference between a cavity pressure in a cavity in which at least a portion of the pressure vessel is suspended and a vessel pressure in the pressure vessel.

An example pressure sensor is described that includes a semiconductor substrate, a pressure vessel, and a transducer. The semiconductor substrate includes a cavity. The pressure vessel has a cross section that defines a void. The pressure vessel has at least one curved portion that is configured to structurally deform based on a pressure difference between a cavity pressure in the cavity and a vessel pressure in the pressure vessel. At least a first portion of the pressure vessel is suspended in the cavity. The transducer is coupled to the first portion of the pressure vessel. The transducer has an attribute that changes with structural deformation of the pressure vessel.

Example methods are also described. In a first example method, a semiconductor substrate that includes a cavity is provided. A pressure vessel having a cross section that defines a void is fabricated. The pressure vessel has at least one curved portion that is configured to structurally deform based on a pressure difference between a cavity pressure in the cavity and a vessel pressure in the pressure vessel. At least a portion of the pressure vessel is suspended in the cavity. A transducer coupled to the portion of the pressure vessel is fabricated. The transducer has an attribute that changes with structural deformation of the pressure vessel.

In a second example method, a cavity pressure is received in a cavity that is included in a semiconductor substrate of a pressure sensor. A vessel pressure is received in a pressure vessel of the pressure sensor. The pressure vessel has a cross section that defines a void. The pressure vessel has at least one curved portion that is configured to structurally deform based on a pressure difference between the cavity pressure and the vessel pressure. At least a portion of the pressure vessel is suspended in the cavity. An attribute of a transducer that is coupled to the portion of the pressure vessel is measured. The attribute changes with structural deformation of the pressure vessel.

Example systems are also described. A first example system includes cavity logic, vessel logic, and transducer logic. The cavity logic is configured to provide a semiconductor substrate that includes a cavity. The vessel logic is configured to fabricate a pressure vessel having a cross section that defines a void. The pressure vessel has at least one curved portion that is configured to structurally deform based on a pressure difference between a cavity pressure in the cavity and a vessel pressure in the pressure vessel. At least a portion of the pressure vessel is suspended in the cavity. The transducer logic is configured to fabricate a transducer coupled to the portion of the pressure vessel. The transducer has an attribute that changes with structural deformation of the pressure vessel.

A second example system includes measurement logic. A cavity that is included in a semiconductor substrate of a pressure sensor receives a cavity pressure. A pressure vessel of the pressure sensor receives a vessel pressure. The pressure vessel has a cross section that defines a void. The pressure vessel has at least one curved portion that is configured to structurally deform based on a pressure difference between the cavity pressure and the vessel pressure. At least a portion of the pressure vessel is suspended in the cavity. A transducer is coupled to the portion of the pressure vessel. The measurement logic measures an attribute of the transducer that changes with structural deformation of the pressure vessel.

An example computer program product is also described. The computer program product includes a computer-readable medium having computer program logic recorded thereon for enabling a processor-based system to fabricate a pressure sensor. The computer program logic includes a first program logic module, a second program logic module, and a third program logic module. The first program logic module is for enabling the processor-based system to provide a semiconductor substrate that includes a cavity. The second program logic module is for enabling the processor-based system to fabricate a pressure vessel having a cross section that defines a void. The pressure vessel has at least one curved portion that is configured to structurally deform based on a pressure difference between a cavity pressure in the cavity and a vessel pressure in the pressure vessel. At least a portion of the pressure vessel is suspended in the cavity. The third program logic module is for enabling the processor-based system to fabricate a transducer coupled to the portion of the pressure vessel. The transducer has an attribute that changes with structural deformation of the pressure vessel.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter. Moreover, it is noted that the invention is not limited to the specific embodiments described in the Detailed Description and/or other sections of this document. Such embodiments are presented herein for illustrative purposes only. Additional embodiments will be apparent to persons skilled in the relevant art(s) based on the teachings contained herein.

BRIEF DESCRIPTION OF THE DRAWINGS/FIGURES

The accompanying drawings, which are incorporated herein and form a part of the specification, illustrate embodiments and, together with the description, further serve to explain the principles of the embodiments and to enable a person skilled in the pertinent art to make and use the disclosed technologies.

Figure 1:
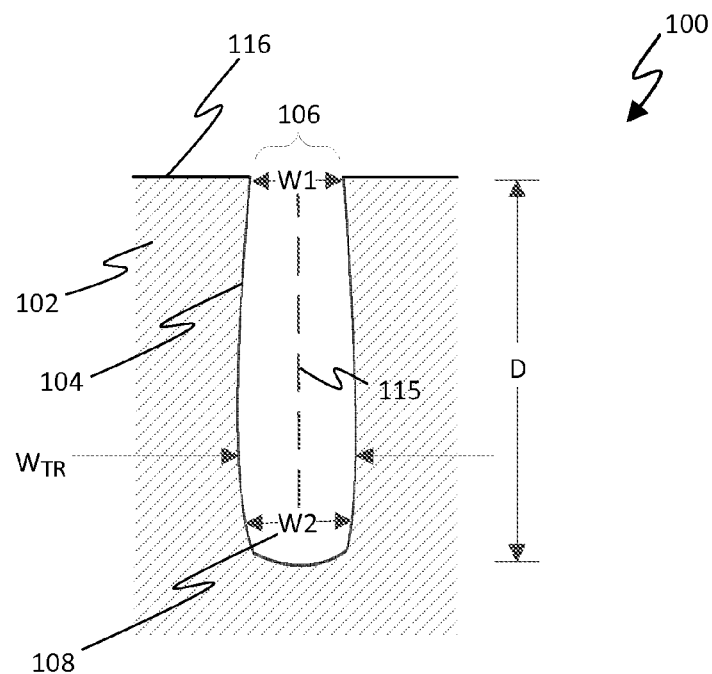
FIGS. 1-3 show cross-sections of a wafer to illustrate fabrication of a pressure vessel in accordance with embodiments described herein.

The features and advantages of the disclosed technologies will become more apparent from the detailed description set forth below when taken in conjunction with the drawings, in which like reference characters identify corresponding elements throughout. In the drawings, like reference numbers generally indicate identical, functionally similar, and/or structurally similar elements. The drawing in which an element first appears is indicated by the leftmost digit(s) in the corresponding reference number.

DETAILED DESCRIPTION

I. Introduction

The following detailed description refers to the accompanying drawings that illustrate exemplary embodiments of the present invention. However, the scope of the present invention is not limited to these embodiments, but is instead defined by the appended claims. Thus, embodiments beyond those shown in the accompanying drawings, such as modified versions of the illustrated embodiments, may nevertheless be encompassed by the present invention.

References in the specification to "one embodiment," "an embodiment," "an example embodiment," or the like, indicate that the embodiment described may include a particular feature, structure, or characteristic, but every embodiment may not necessarily include the particular feature, structure, or characteristic. Moreover, such phrases are not necessarily referring to the same embodiment. Furthermore, when a particular feature, structure, or characteristic is described in connection with an embodiment, it is submitted that it is within the knowledge of one skilled in the relevant art(s) to implement such feature, structure, or characteristic in connection with other embodiments whether or not explicitly described.

II. Example Embodiments

Example embodiments described herein are capable of performing pressure sensor techniques (e.g., capacitance-based pressure sensor techniques) using pressure sensor(s) that include deformable pressure vessel(s). A pressure vessel is an object that has a cross section that defines a void. A deformable pressure vessel is a pressure vessel that has at least one curved portion that is configured to structurally deform (e.g., bend, shear, elongate, etc.) based on a pressure difference between a cavity pressure in a cavity in which at least a portion of the pressure vessel is suspended and a vessel pressure in the pressure vessel.

A pressure sensor may include structures that are sculpted out of one piece of single-crystal silicon. Sculpting the structures from one piece of single-crystal silicon may provide benefits from a mechanical perspective, for example, because the silicon may include relatively few flaws (e.g., no flaws) and/or the silicon may be a relatively well controlled material. Some pressure sensors described herein are capacitive-based, meaning that those pressure sensors include one or more capacitors to measure pressure differences. In order to fabricate capacitors having plates that are not shorted together, an isolation technology may be used. For instance, a trench isolation process may be employed in which insulating segments are embedded into a wafer before the structures are sculpted, so that the insulating segments electrically insulate but mechanically couple the pieces of the structures together. It will be recognized that isolation technologies mentioned herein are not limited to use in capacitive-based pressure sensors. For instance, the isolation technologies may be used in any suitable type of pressure sensors (e.g., non-capacitive-based pressure sensors). Some example techniques for embedding insulating segments into a wafer are described in U.S. Pat. App. Pub. No. 2012/0205752, entitled "Strengthened Micro-Electromechanical System Devices and Methods of Making Thereof," which is incorporated by reference herein in its entirety.

Example techniques described herein have a variety of benefits as compared to conventional techniques for sensing pressure. For instance, the example techniques may be characterized by a relatively low stress/thermal sensitivity. Accordingly, the example techniques may be less affected by external package stress than conventional pressure sensing techniques. For instance, the example pressure sensors described herein may have a support structure configured to physically support pressure vessel(s) that hinders external tensions from being transmitted into a sensing area of the pressure sensors. A sensing area of a pressure sensor is defined by a cavity in a semiconductor substrate. Accordingly, the example techniques may be capable of coupling external pressure changes internally to the pressure sensor while hindering temperature-induced external package stress from being coupled internally to the pressure sensor.

For example, a distance between a point at which a pressure vessel connects to the substrate and a point at which the pressure vessel connects to a transducer may be relatively small. In another example, a distance between a point at which the transducer connects to the substrate and a point at which the transducer connects to the pressure vessel may be relatively small. In yet another example, a distance between a point at which the pressure vessel connects to the substrate and a point at which the transducer connects to the substrate may be relatively small. Fabricating a pressure sensor to be characterized by any one or more of the aforementioned relatively small distances may result in a relatively lower probability of package stress entering the pressure sensor, as compared to conventional pressure sensors. For instance, any one or more of the aforementioned distances may be less than or equal to one-third of a length of a smaller side of a surrounding rectangle, which is a rectangle having a smallest area (in a plane of a wafer from which the pressure sensor is fabricated) that surrounds the cavity in which at least a portion of the pressure vessel is suspended. The described pressure sensors may be insensitive to changes of temperature. The described pressure sensors may be characterized by a relatively high signal-to-noise ratio (SNR) as compared to conventional pressure sensors.

The example pressure sensors described herein may be characterized by a relatively low manufacturing cost. For instance, the described pressure sensors may be fabricated based on existing fabricating techniques. The described pressure sensors may be capable of being fabricated using a fabrication process that is similar to or same as a process that is used to fabricate inertial sensors, such as accelerometers and/or gyroscopes. For instance, building pressure sensors on the same wafer as such accelerometers and/or gyroscopes (e.g., simultaneously) may reduce cost of the pressure sensors. The pressure sensors may share a common sensing principle (e.g., variable capacitance-based motion sensing) with accelerometers and/or gyroscopes. Accordingly, a pressure sensor, an accelerometer, and/or a gyroscope may share circuitry, such that fabricating them on the same wafer may result in a relatively small incremental cost of the wafer or the devices fabricated thereon.

Figure 2:
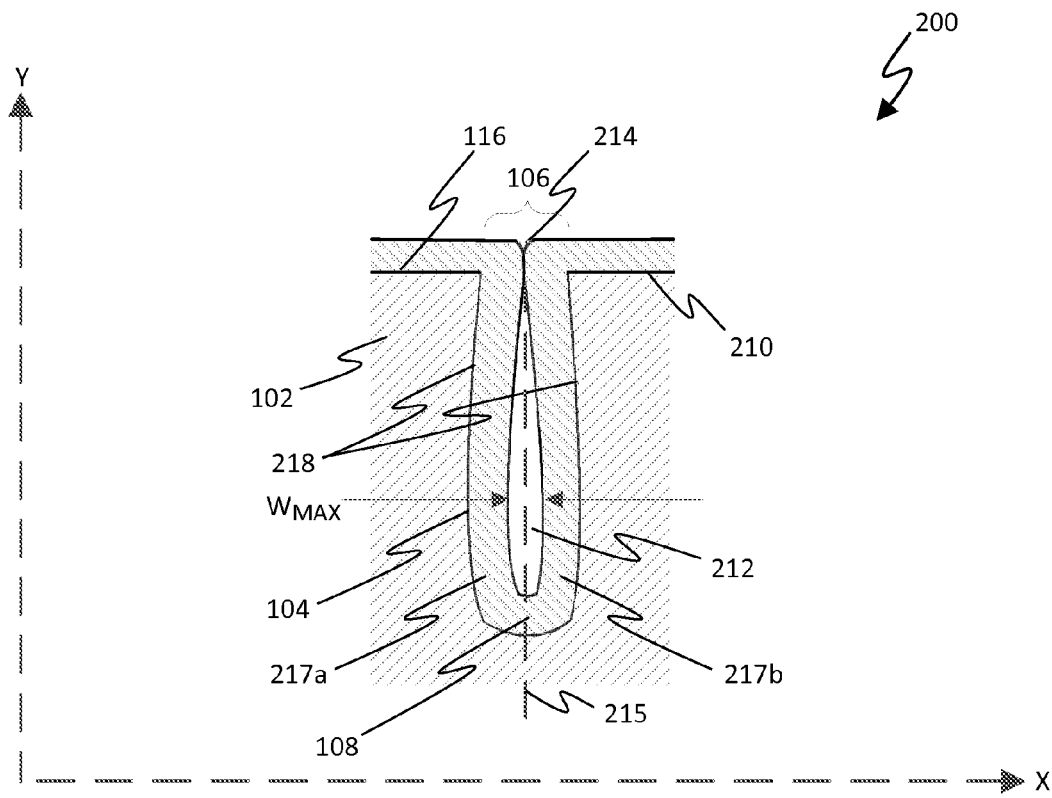
Figure 3:
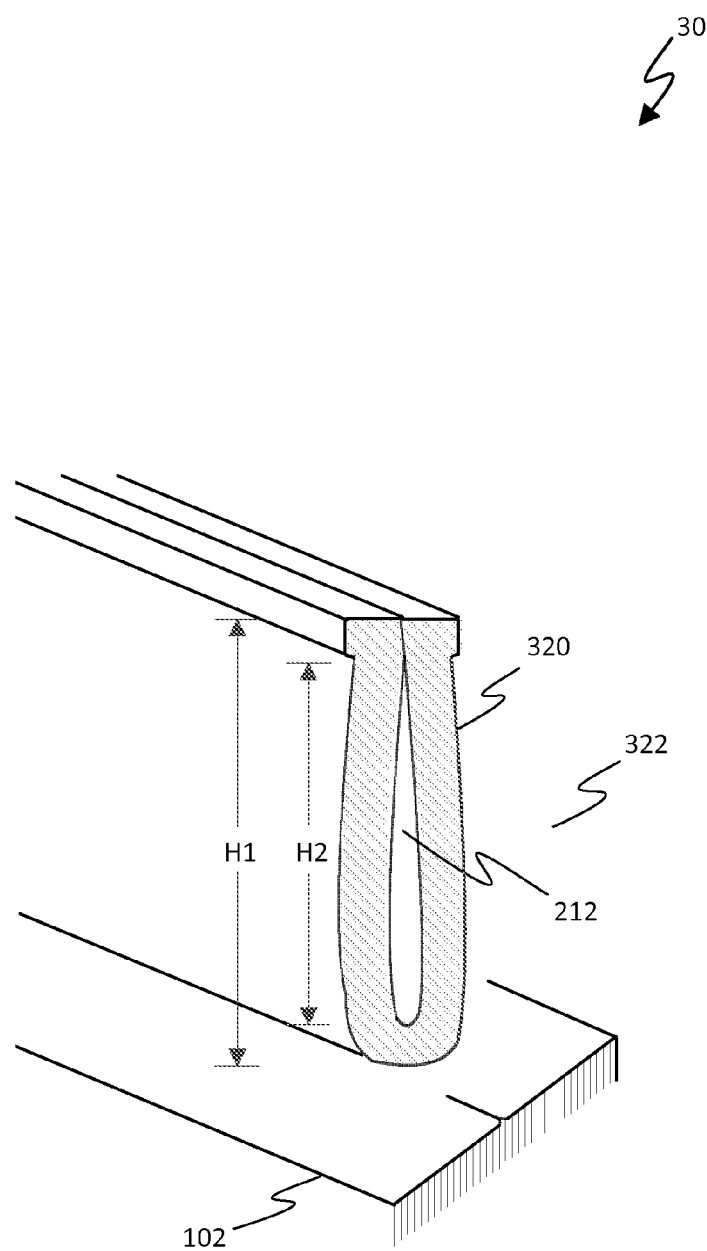

FIGS. 1-3 show cross-sections 100, 200, and 300 of a wafer to illustrate fabrication of a pressure vessel in accordance with embodiments described herein. The fabrication may be based on a process used to construct micromechanical devices as described in U.S. Pat. No. 6,239,473, entitled "Trench Isolation for Micromechanical Devices," though the scope of the example embodiments is not limited in this respect. A portion of the process, which is described in U.S. Pat. No. 6,239,473, is depicted in FIGS. 1-3. U.S. Pat. No. 6,239,473 is incorporated by reference herein in its entirety.

As shown in FIG. 1, a trench 104 is formed in a wafer 102. It should be noted that wafers discussed herein may be referred to as silicon wafers for illustrative purposes and are not intended to be limiting. It will be recognized that each wafer (e.g., wafer 102) may include any suitable type of material, including but not limited to silicon, gallium arsenide, etc. Trench 104 may be formed by deep reactive ion etching using high etch rate, high selectivity etching, though the scope of the example embodiments is not limited in this respect. Trench 104 may be etched in a high density plasma using an SF6 gas mixture, for example. One technique for etching a trench in a high density plasma using an SF6 gas mixture is described in U.S. Pat. No. 5,501,893, entitled "Method of Anisotropically Etching Silicon," which is incorporated by reference herein in its entirety.

Trench 104 may have various widths at respective points along an axis 115, which is perpendicular to a top surface 116 of wafer 102, in a cross section of trench 104. The etch used to form trench 104 may be controlled so that a profile of trench 104 is reentrant, or tapered, with an opening 106 of trench 104 having a width, W1, that is narrower than a width, W2, of a bottom 108 of trench 104. Such tapering may increase a likelihood that electrical isolation is achieved in subsequent processing. Profile tapering can be achieved in reactive ion etching by tuning the degree of passivation, or by varying parameter(s) (e.g., power, gas flows, and/or pressure) of a discharge during the etching. Because trench 104 is to be at least partially filled with a dielectric, the width, W1, of opening 106 may be chosen to be relatively small (e.g., less than 2 microns (μm)). A depth, D, of trench 104 may be in a range of 10-50 p.m. The width, W2, of the bottom 108 of trench 104 may be in a range of 2-3 p.m. The example width and depth measurements mentioned above are provided for illustrative purposes and are not intended to be limiting. It will be recognized that any suitable width and depth values may be used.

A maximum width, $W_{TR}$, of trench 104 is defined as a width of trench 104 at a point along the axis 115 that is not less than a width of trench 104 at any other point along the axis 115. The maximum width, $W_{TR}$, of trench 104 may be substantially less than the depth, D, of trench 104, though the scope of the example embodiments is not limited in this respect. An aspect ratio of trench 104 is defined as $D/W_{TR}$ (i.e., the depth of trench 104 divided by the maximum width of trench 104). The aspect ratio may be any suitable value (e.g., greater than three, greater than 3.5, greater than four, greater than five, etc.). For instance, trench 104 may be configured to have an aspect ratio greater than four to promote manufacturability and/or pressure sensing performance of example pressure sensors described herein.

Etching the trench 104 may include alternating etch steps (SF 6 and argon mixture) with passivation steps (Freon with argon) in an inductively coupled plasma (ICP) to achieve etch rates in excess of 2 μm/min at high selectivity to photoresist (>50:1) and oxide (>100:1). The power and duration of the etch cycles may be increased as trench 104 deepens to achieve the tapered profile. Although the geometry of trench 104 is shown to be reentrant, arbitrary trench profiles can be accommodated with adjustments in microstructure processing. Adequate isolation results can be achieved with any of a variety of known trench etch chemistries.

As shown in FIG. 2, wafer 102 is oxidized. By oxidizing the wafer 102, a silicon dioxide layer 210 (or other suitable insulating dielectric material) is provided on a top surface 116 of wafer 102 and along sidewalls 218 and bottom 108 of trench 104. For instance, the silicon dioxide layer 210 may form a silicon dioxide lining along sidewalls 218 and the bottom 108 of trench 104. The thickness of silicon dioxide layer 210 may be in excess of 1 μm, for example. The provision of silicon dioxide layer 210 may be accomplished using a chemical vapor deposition (CVD) technique or with oxidation of silicon at relatively high temperatures. In thermal oxidation, wafer 102 may be exposed to an oxygen rich environment at temperatures in a range of 900-1150° C. In this example, the oxidation process consumes silicon surfaces to form silicon dioxide layer 210. It will be recognized that the wafer may be formed from any suitable type of semiconductor material, and the surfaces thereof may be consumed to form an oxide layer other than silicon dioxide. The resulting volumetric expansion from this process causes sidewalls 218 of trench 104 to encroach upon each other, and silicon dioxide layer 210 seals at location 214, thereby closing opening 106.

Because the width, W1, of the opening 106 of trench 104 is narrower than the width, W2, of the bottom 108 of trench 104, a void 212 is formed. The void 212 normally may be undesirable in manufacturing; however, in the embodiments described herein, the void 212 is used as the basis of the pressure sensor design.

The void 212 may have various widths at respective points along an axis 215, which is perpendicular to top surface 116 of wafer 102, in a cross section of the void 212. A maximum width, WMAX, of the void 212 is defined as a width of the void 212 at a point along the axis 215 that is not less than a width of the void 212 at any other point along the axis 215. The void 212 may be formed to have a maximum width that is less than a designated distance. For instance, the void may be formed to have a maximum width that is less than 2 nm, less than 1 nm, less than 0.3 nm, or less than any other suitable distance.

In an example embodiment, oxidizing the wafer 102 causes first and second oxide walls 217a and 217b to be formed on opposing sides of the axis 215 to define the void 212 between first and second oxide walls 217a and 217b.

As shown in FIG. 3, through subsequent patterning and release steps, silicon dioxide layer 210 is released from contact with wafer 102 to provide a pressure vessel 320. Differences between a pressure in the void 212 and a pressure in surrounding area 322 cause pressure vessel 320 to structurally deform (e.g., bend, shear, elongate, etc.). It will be recognized that such differences may cause a shape of void 212 to change, though the scope of the example embodiments is not limited in this respect.

The extent to which pressure vessel 320 deforms is proportional to the maximum width of the void 212; whereas, the stiffness of pressure vessel 320 increases with a cube of the maximum width of the void 212. Accordingly, it may be non-intuitive that utilizing pressure vessel 320 having a cross section that defines a void with relatively small dimensions is capable of providing a desired pressure sensing functionality. For instance, it may be expected that relatively larger structures (e.g., the diaphragms of many conventional pressure sensors) provide greater compliance (i.e., less stiffness) as compared to relatively smaller structures. However, the size scale of pressure sensor 320 may be sufficiently small that the resulting increase of compliance of pressure sensor 320 outweighs the resulting reduction in deformation of pressure sensor 320. Pressure vessel 320 may be configured to have a height, H1, of less than 50 μm, less than 40 μm, less than 30 μm, less than 20 μm, or any other suitable height. The void 212 may be configured to have a height, H2, of less than 30 μm, less than 20 μm, less than 10 μm, less than 5 μm, or any other suitable height.

Figure 4:
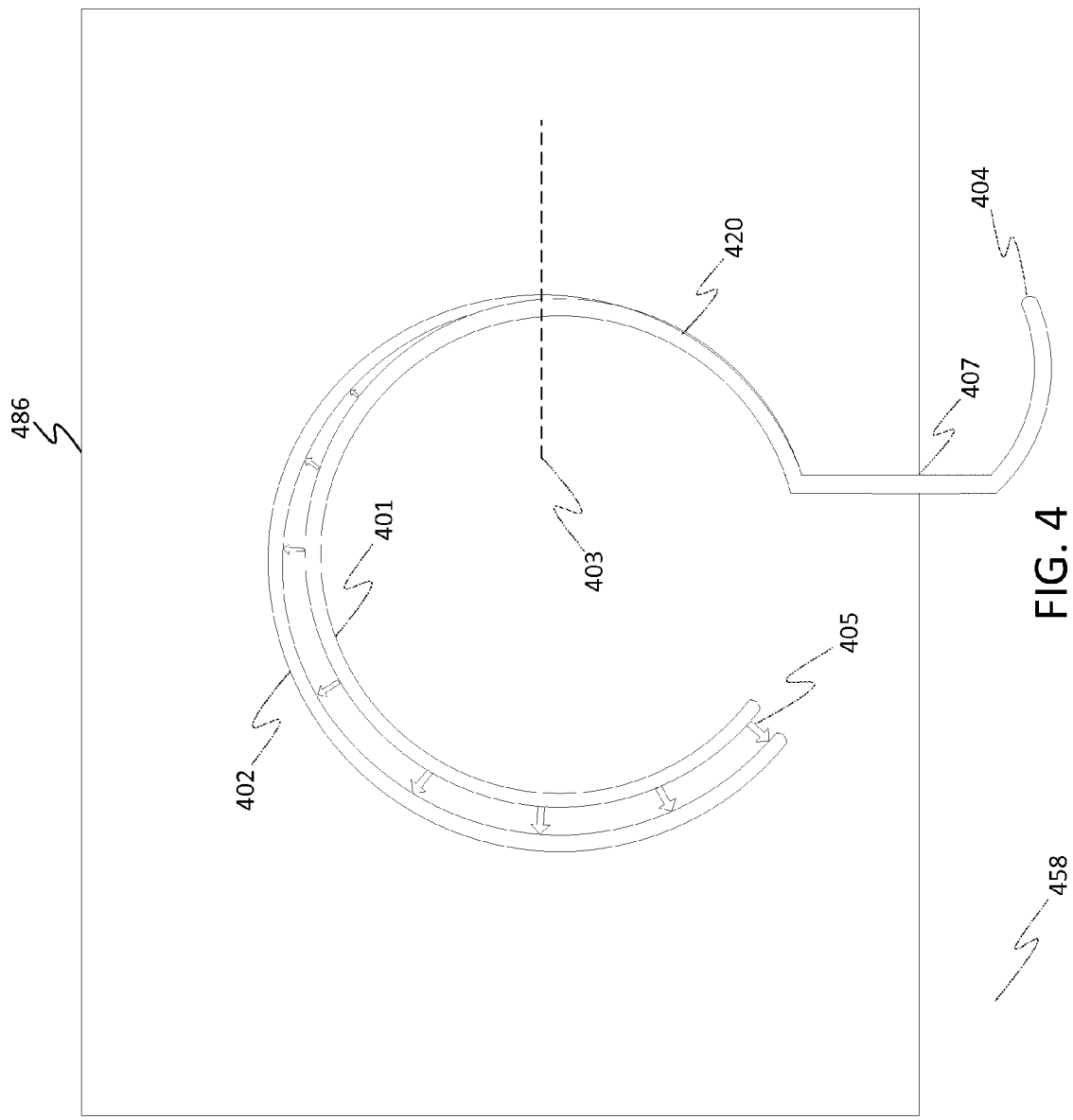
FIG. 4 is a top view of an example deformable pressure vessel having a shape of a sickle in accordance with an embodiment described herein.

FIG. 4 is a top view of an example deformable pressure vessel 420 having a shape of a sickle in accordance with an embodiment described herein. Pressure vessel 420 is shown to be suspended in a cavity 486 that is etched out of a wafer 458. Pressure vessel 420 is supported by cavity 486 at location 407. A cross-section of pressure vessel 420 may be defined at a plane 403. It will be recognized that the cross-section defined at plane 403 may be depicted as the cross-section 300 shown in FIG. 3. In the embodiment of FIG. 4, when a vessel pressure in pressure vessel 420 equals a cavity pressure in cavity 486, pressure vessel 420 has a non-deformed shape 401. When the vessel pressure becomes greater than the cavity pressure, pressure vessel 420 structurally deforms (as depicted by arrows 405), causing pressure vessel 420 to have a deformed shape 402. A pressure that is external to cavity 486 sets the vessel pressure in pressure vessel 420 at a vessel pressure port 404.

Vessel pressure port 404 is an opening in pressure vessel 420 that exposes the vessel pressure in pressure vessel 420 to an environment that is external to pressure vessel 420. A pressure port is an opening that exposes one or more environments to one or more other environments. Accordingly, vessel pressure port 404 constitutes a pressure port. A vessel pressure port is an opening in a pressure vessel that exposes one or more environments to one or more other environments. Accordingly, vessel pressure port 404 also constitutes a vessel pressure port.

Pressure vessel 420 is shown to have a sickle shape for illustrative purposes and is not intended to be limiting. It will be recognized that pressure vessel 420 may have any suitable shape. For example, pressure vessel may include a serpentine shape, a spiral shape, a semicircular shape, multiple concentric semicircular portions each having a semicircular shape, a linear shape that is capable of elongation, etc. or any combination thereof.

Figure 5:
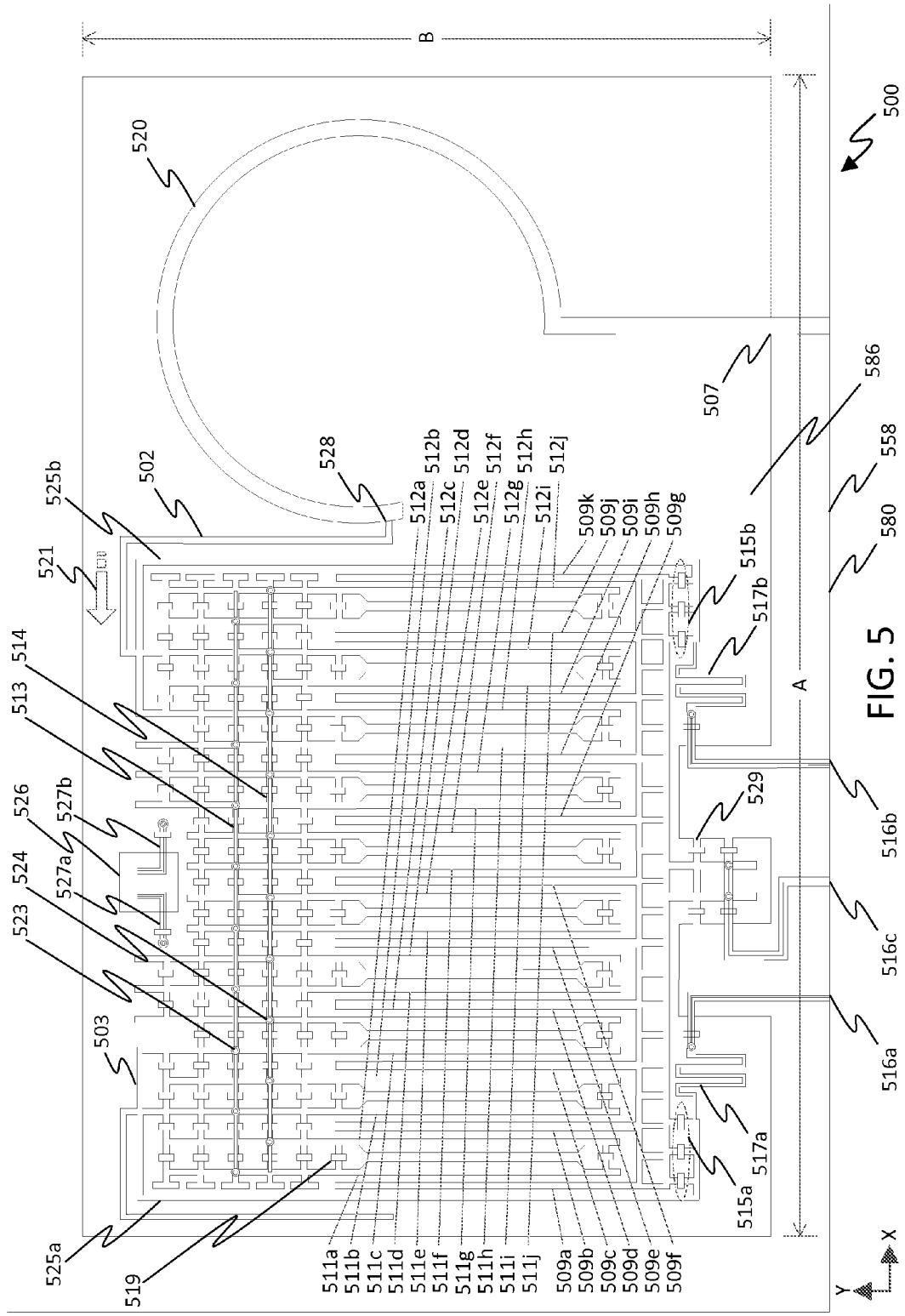
FIG. 5 shows an example pressure sensor that includes the deformable pressure vessel shown in FIG. 4 in accordance with an embodiment described herein.

FIG. 5 shows a pressure sensor 500 that includes a deformable pressure vessel 520 in accordance with an embodiment described herein. As shown in FIG. 5, pressure sensor 500 further includes a transducer 503, which is mechanically coupled to pressure sensor 520 by an intermediate structural element 502 (a.k.a. a mechanical couple). Pressure vessel 520, transducer 503, and intermediate structural element 502 (or at least a portion thereof) are suspended in a cavity 586 that is etched out of a wafer 558. Pressure vessel 520 is supported by semiconductor substrate 580 of wafer 558 at point 507. As depicted in FIG. 5, transducer 503 is primarily a silicon structure etched out of wafer 558. Transducer 503 includes a first set of capacitor plates 511a-511j, a second set of capacitor plates 512a-512j, and a third set of capacitor plates 509a-509k. Capacitor plates 511a and 512a are positioned between capacitor plates 509a and 509b; capacitor plates 511b and 512b are positioned between capacitor plates 509b and 509c; capacitor plates 511c and 512c are positioned between capacitor plates 509c and 509d, and so on. Capacitor plate 511a is between capacitor plate 509a and capacitor plate 512a; capacitor plate 511b is between capacitor plate 509b and capacitor plate 512b; and so on. Capacitor plate 512a is between capacitor plate 511a and capacitor plate 509b; capacitor plate 512b is between capacitor plate 511b and 509c, and so on.

The capacitor plates 511a-511j in the first set are electrically coupled using electrical trace 513 and vias 523. For instance, vias 523 electrically couple electrical trace 513 to respective capacitor plates 511a-511j. The capacitor plates 512a-512j in the second set are electrically coupled. For instance, vias 524 electrically couple electrical trace 514 to respective capacitor plates 512a-512j. The capacitor plates 509a-509k in the third set are electrically coupled.

The first set of capacitor plates 511a-511j is electrically isolated from the second set of capacitor plates 512a-512j and the third set of capacitor plates 509a-509k. For instance, isolation segments 519 isolate the first set of capacitor plates 511a-511j from the second set of capacitor plates 512a-512j, and isolation segments 515a isolate the first set of capacitor plates 511a-511j from the third set of capacitor plates 509a-590k. The second set of capacitor plates 512a-512j is also electrically isolated from the third set of capacitor plates 509a-509k. For instance, isolation segments 515b isolate the second set of capacitor plates 512a-512j from the third set of capacitor plates 509a-509k. Accordingly, it can be seen that utilizing isolation segments (e.g., isolation segments 515a-515b and 519) may enable various regions of transducer 503 to be mechanically connected but electrically isolated.

A first capacitance is provided based on a proximity of capacitor plates 511a-511j in the first set to respective capacitor plates 509a-509j in the third set. A second capacitance is provided based on a proximity of capacitor plates 512a-512j in the second set to respective capacitor plates 509b-509k in the third set. Capacitor plates 509a-509j in the third set may be referred to as a first subset of the third set, and capacitor plates 509b-509k in the third set may be referred to as a second subset of the third set. Each of the first subset and the second subset may be referred to as a set unto itself. It should be noted that capacitor plates 511a-511j in the first set are deemed to be interleaved with capacitor plates 509a-509k in the third set, even though capacitor plates 512a-512j in the second set are also interleaved with capacitor plates 509a-509k. Similarly, capacitor plates 512a-512j in the second set are deemed to be interleaved with capacitor plates 509a-509k in the third set, even though capacitor plates 511a-511j in the first set are also interleaved with capacitor plates 509a-509k As a pressure difference between a vessel pressure in pressure vessel 520 and a cavity pressure in cavity 586 changes, pressure vessel 520 structurally deforms. As pressure vessel 520 deforms, the structural deformation of pressure vessel 520 is coupled to transducer 503 through intermediate structural element 502, which causes the first set of capacitor plates 511a-511j and the second set of capacitor plates 512a-512j to move with reference to the third set of capacitor plates 509a-509k, as indicated by arrow 521. For instance, springs 525a and 525b enable the first set of capacitor plates 511a-511j and the second set of capacitor plates 512a-512j to move with reference to the third set of capacitor plates 509a-509k. Springs 525a and 525b are relatively flexible as compared to other portions of transducer 503. Note that serpentine flex leads 517a and 517b are also relatively flexible as compared to other portions of transducer 503. Serpentine flex leads 517a and 517b are discussed in further detail below.

Movement of the first set of capacitor plates 511a-511j and the second set of capacitor plates 512a-512j in the direction of arrow 521 (i.e., to the left in FIG. 5) causes a distance between capacitor plates 511a-511j and respective capacitor plates 509a-590j to decrease, which causes the first capacitance (i.e., the capacitance between capacitor plates 511a-511j and respective capacitor plates 509a-590j) to increase. The aforementioned movement also causes a distance between capacitor plates 512a-512j and respective capacitor plates 509b-590k to increase, which causes the second capacitance (i.e., the capacitance between capacitor plates 512a-512j and respective capacitor plates 509b-590k) to decrease. Accordingly, in the embodiment of FIG. 5, the change of the first capacitance is opposite the change of the second capacitance.

Serpentine flex leads 517a and 517b provide respective flexible mechanical connections between transducer 503 and semiconductor substrate 580. For instance, the use of serpentine flex leads 517a and 517b may hinder package stress from affecting the motion of the first set of capacitor plates 511a-511j and the second set of capacitor plates 512a-512j with respect to the third set of capacitor plates 509a-509k. Serpentine flex lead 517a electrically couples an electrical characteristic (e.g., charge) associated with the first set of capacitor plates 511a-511j to a first trace 516a. Serpentine flex lead 517b electrically couples an electrical characteristic (e.g., charge) associated with the second set of capacitor plates 512a-512j to a second trace 516b. An electrical characteristic (e.g., charge) associated with the third set of capacitor plates 509a-509k is electrically coupled to a third trace 516c.

A measuring circuit (e.g., an electrical circuit) may be electrically coupled to the first trace 516a, the second trace 516b, and/or the third trace 516c to perform a single-ended or differential capacitance measurement that represents the pressure difference between the vessel pressure in pressure vessel 520 and the cavity pressure in cavity 586. It will be recognized that any of a variety of well-known capacitance measurement techniques may be used to provide a single-ended representation or a differential representation of the pressure difference. In one example, a combination of multiple (e.g., two) single-ended capacitive measurements may be used to provide a differential capacitive measurement. In accordance with this example, the combination may be a summation to obtain a measure of the pressure difference; the combination may be a subtraction to obtain a measure of acceleration. It will be recognized that changing the routing of traces 516a-516c may change whether a difference or a sum is used to obtain the aforementioned measure of the pressure difference or measure of acceleration. Differential capacitance measurements are discussed in further detail below, primarily with regard to FIG. 10.

Transducer 503 is shown to include a bump-stop 526, which is configured to limit an extent with which the first set of capacitor plates 511a-511j and the second set of capacitor plates 512a-512j move with reference to the third set of capacitor plates 509a-509k. Traces 527a and 527b are provided on bump-stop 526. Trace 527a has a same electrical potential (i.e., voltage) as the second set of capacitor plates 512a-512j and the second trace 516b. Trace 527b has a same electrical potential as the first set of capacitor plates 511a-511j and the first trace 516a. A single bump-stop 526 is shown in FIG. 5 for illustrative purposes and is not intended to be limiting. It will be recognized that transducer 503 may include any suitable number of bump-stops (e.g., none, one, two, three, etc.).

Transducer 503 is depicted as a deformable capacitor structure in FIG. 5 for illustrative purposes and is not intended to be limiting. Transducer 503 may be any suitable type of transducer. For instance, a person of ordinary skilled in the art will recognize that transducer 503 may include a structure that uses piezoelectric and/or piezoresistive technique(s) to transduce the motion of pressure vessel 520 into an electrical signal. For example, transducer 503 may include a piezoelectric element that is configured to generate a charge (e.g., electrical charge) based on a force (e.g., mechanical stress) that is applied to the piezoelectric element as a result of the structural deformation of pressure vessel 520. In accordance with this example, the force may cause a strain of the piezoelectric element that causes the piezoelectric element to generate the charge. In another example, transducer 503 may include a piezoresistive element having a resistance (e.g., electrical resistance) that changes based on a force (e.g., mechanical stress) that is applied to the piezoresistive element as a result of the deformation of the pressure vessel 520. In accordance with this example, the force may cause a strain of the piezoresistive element that causes the resistance of the piezoresistive element to change. Furthermore, optical and/or magnetic techniques may be used to sense the motion of pressure vessel 520. It will be recognized that transducer 503 may be fabricated in any of a variety of ways, e.g., with or without isolation segments 515. It will be further recognized that transducer 503 may be fabricated using silicon on insulator (SOI) wafers or epitaxial silicon.

In an example embodiment, transducer 503 and deformable pressure vessel 520 are formed using the same process. For example, the process may include any suitable number of etching steps and/or any suitable number of lithography steps. In one aspect of this embodiment, the same etching step(s) may be used to form transducer 503 and deformable pressure vessel 520. In another aspect, first etching step(s) may be used to form transducer 503, and second etching step(s) that are different from the first etching step(s) may be used to form pressure vessel 520. In accordance with this aspect, the first etching step(s) may configure (e.g., optimize) a geometry of transducer 503 for the intended function of transducer 503, and the second etching step(s) may configure (e.g., optimize) a geometry of pressure vessel 520 for the intended function of pressure vessel 520. A geometry of transducer 503 or pressure vessel 520 may include a shape of a dielectric therein, a thickness of a dielectric therein, etc. or any combination thereof. For instance, a geometry of pressure vessel 520 may include a maximum width of a trench in which pressure vessel 520 is formed, a depth of a trench in which pressure vessel 520 is formed, a maximum width of a void formed by a dielectric from which pressure vessel 520 is formed, a depth of a void formed by a dielectric from which pressure vessel 520 is formed, etc. or any combination thereof.

In yet another aspect of this embodiment, the same lithography step(s) may be used to form transducer 503 and deformable pressure vessel 520. In still another aspect, first lithography step(s) may be used to form transducer 503, and second lithography step(s) that are different from the first lithography step(s) may be used to form pressure vessel 520. In accordance with this aspect, the first lithography step(s) may configure (e.g., optimize) a geometry of transducer 503 for the intended function of transducer 503, and the second lithography step(s) may configure (e.g., optimize) a geometry of pressure vessel 520 for the intended function of pressure vessel 520.

In another example embodiment, transducer 503 and deformable pressure vessel 520 share the same dielectric. In yet another example embodiment, a dielectric used to form transducer 503 is different from a dielectric used to form deformable pressure vessel 520.

In FIG. 5, location 507 is a location (a.k.a. a point) at which pressure vessel 520 couples to semiconductor substrate 580. Location 528 is a location at which pressure vessel 520 couples to transducer 503. Location 529 is a location at which transducer 503 couples to semiconductor substrate 580. Reducing (e.g., minimizing) a distance between location 507 and location 528, a distance between location 507 and location 529, and/or a distance between location 528 and location 529 may result in a relatively lower probability of package stress entering pressure sensor 500. Moreover, reducing such distance(s) may reduce (e.g., minimize) an inherent coefficient of thermal expansion (CTE) mismatch between material(s) used to fabricate pressure vessel 520 (e.g., silicon dioxide) and material(s) used to fabricate transducer 503 (e.g., silicon).

Some guidelines for determining the likelihood for package stress to enter pressure sensor 500 may be established by comparing any one or more of the aforementioned distances to a length of at least one side of a rectangle that surrounds cavity 586. For instance, in an example embodiment, pressure sensor 500 is characterized by a surrounding rectangle that is defined by a length A along the X-axis and a length B along the Y-axis. A surrounding rectangle is defined as a rectangle having a smallest area that surrounds a cavity in a plane of a wafer from which a pressure sensor is fabricated. Accordingly, the surrounding rectangle has first parallel sides and second parallel sides that are perpendicular the first parallel sides. Each of the first parallel sides has a first length. Each of the second parallel sides has a second length that is less than or equal to the first length.

The plane defined by the X-axis and the Y-axis in FIG. 5 represents the plane of wafer 558 from which pressure sensor 500 is fabricated. As shown in FIG. 5, the rectangle having the smallest area that surrounds cavity 586 in the plane of wafer 558 has first parallel sides of length A along the X-axis and second parallel sides of length B along the Y-axis. Accordingly, the surrounding rectangle associated with pressure sensor 500 has an area equal to the product of A and B (i.e., A multiplied by B).

In an aspect of this embodiment, the distance between location 507 and location 529 may be less than or equal to one-third of the length B. In another aspect, the distance between location 507 and location 528 may be less than or equal to one-third of the length B. In yet another aspect, the distance between location 528 and location 529 may be less than or equal to one-third of the length B.

Each of traces 513, 514, 516*a*-516*c*, and 527*a*-527*b* may include metallization having a depth of approximately 350 nanometers (nm) and a width of approximately 2 μm, though the scope of the example embodiments is not limited in this respect. It will be recognized that each of traces 513, 514, 516*a*-516*c*, and 527*a*-527*b* may include metallization having any suitable depth and width. Cavity 586 may have a depth, B, of approximately 1 millimeter (mm) and a width, A, of approximately 2 mm, though the scope of the example embodiments is not limited in this respect. It will be recognized that cavity 586 may have any suitable depth and width.

Figure 6:
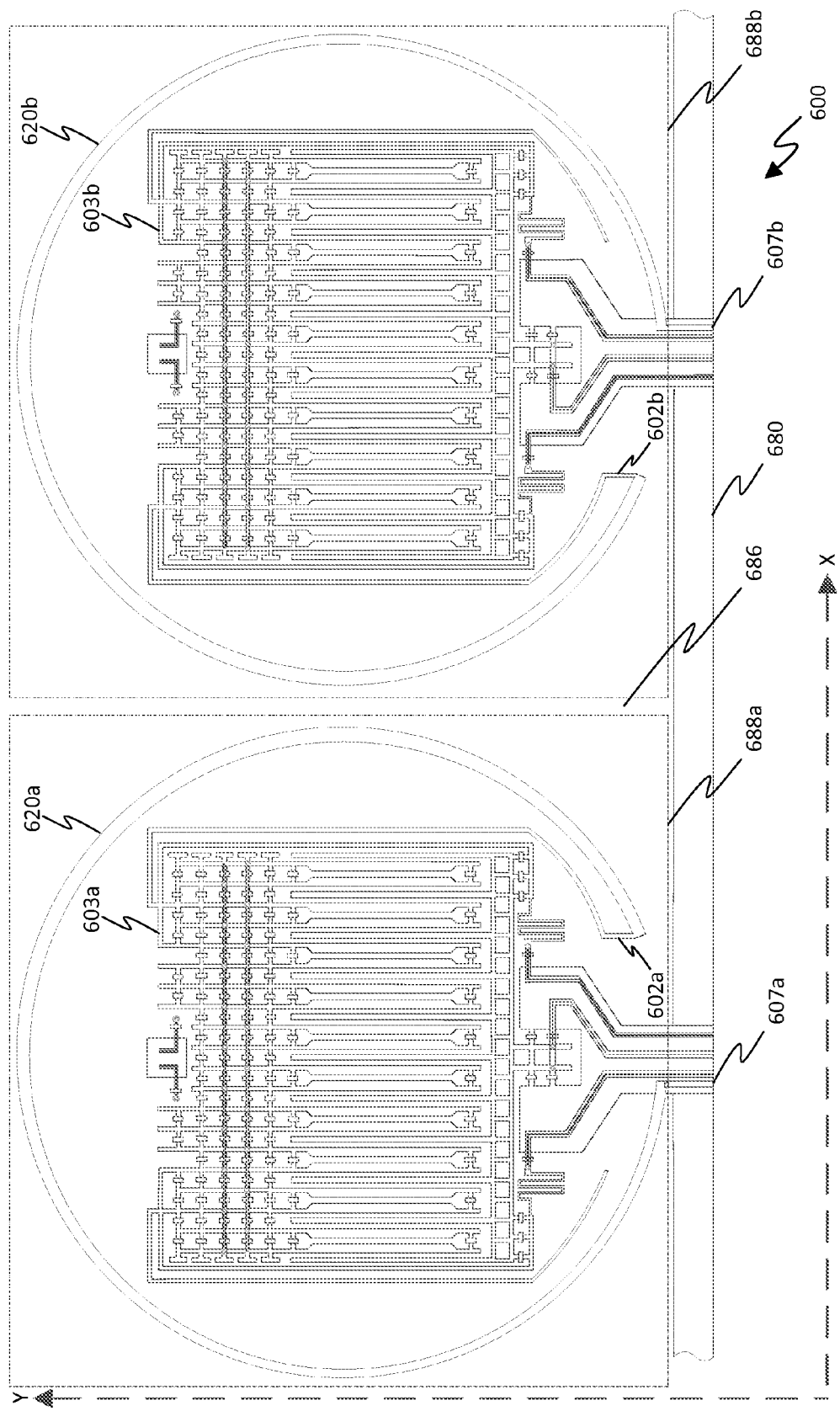
FIGS. 6 and 7 show example pressure sensors that include two sensing elements in accordance with embodiments described herein.

FIG. 6 shows an example pressure sensor 600 that includes two sensing elements 688*a* and 688*b* in accordance with an embodiment described herein. As shown in FIG. 6, pressure sensor 688*a* includes a pressure vessel 620*a* and a corresponding transducer 603*a*, which are mechanically coupled by an intermediate structural element 602*a*. Pressure sensor 688*b* includes a pressure vessel 620*b* and a corresponding transducer 603*b*, which are mechanically coupled by an intermediate structural element 602*b*. Pressure vessels 620*a* and 620*b*, transducers 603*a* and 603*b*, and intermediate structural elements 602*a* and 602*b* (or at least a portion thereof) are suspended in a cavity 686 that is etched out of a semiconductor substrate 680. For purposes of illustration, pressure vessel 620*a* is shown to surround at least a portion of transducer 603*a*, and pressure vessel 620*b* is shown to surround at least a portion of transducer 603*b*. Pressure vessel 620*a* is supported by semiconductor substrate 680 at location 607*a*, and pressure vessel 620*b* is supported by semiconductor substrate 680 at location 607*b*.

Sensing element 688*a* is shown in FIG. 6 to be a mirror image of sensing element 688*b* for illustrative purposes, though the scope of the example embodiments is not limited in this respect. For instance, such symmetry may reduce a sensitivity of pressure sensor 600 to the effects of acceleration. In an example embodiment, pressure sensor 600 is configured such that the vessel pressures in respective pressure vessels 620*a* and 620*b* are substantially equal. In accordance with this embodiment, as the vessel pressure increases in pressure vessels 620*a* and 620*b* to be greater than the cavity pressure in cavity 686, pressure vessels 620*a* and 620*b* deform toward each other (e.g., along the X-axis). In further accordance with this embodiment, transducers 603*a* and 603*b* are configured such that a capacitance associated with transducer 603*a* increases and a capacitance associated with transducer 603*b* decreases with the deformation, or vice versa. By taking the difference between the capacitances, the pressure difference between the vessel pressure and the cavity pressure may be determined By taking the sum of the capacitances, acceleration of pressure sensor 600 along the X-axis may be determined. For instance, each of transducers 603*a* and 603*b* includes the elements of an accelerometer (i.e., a spring, a mass, and a transducer that transduces motion of the mass, e.g., into an electrical signal).

Figure 7:
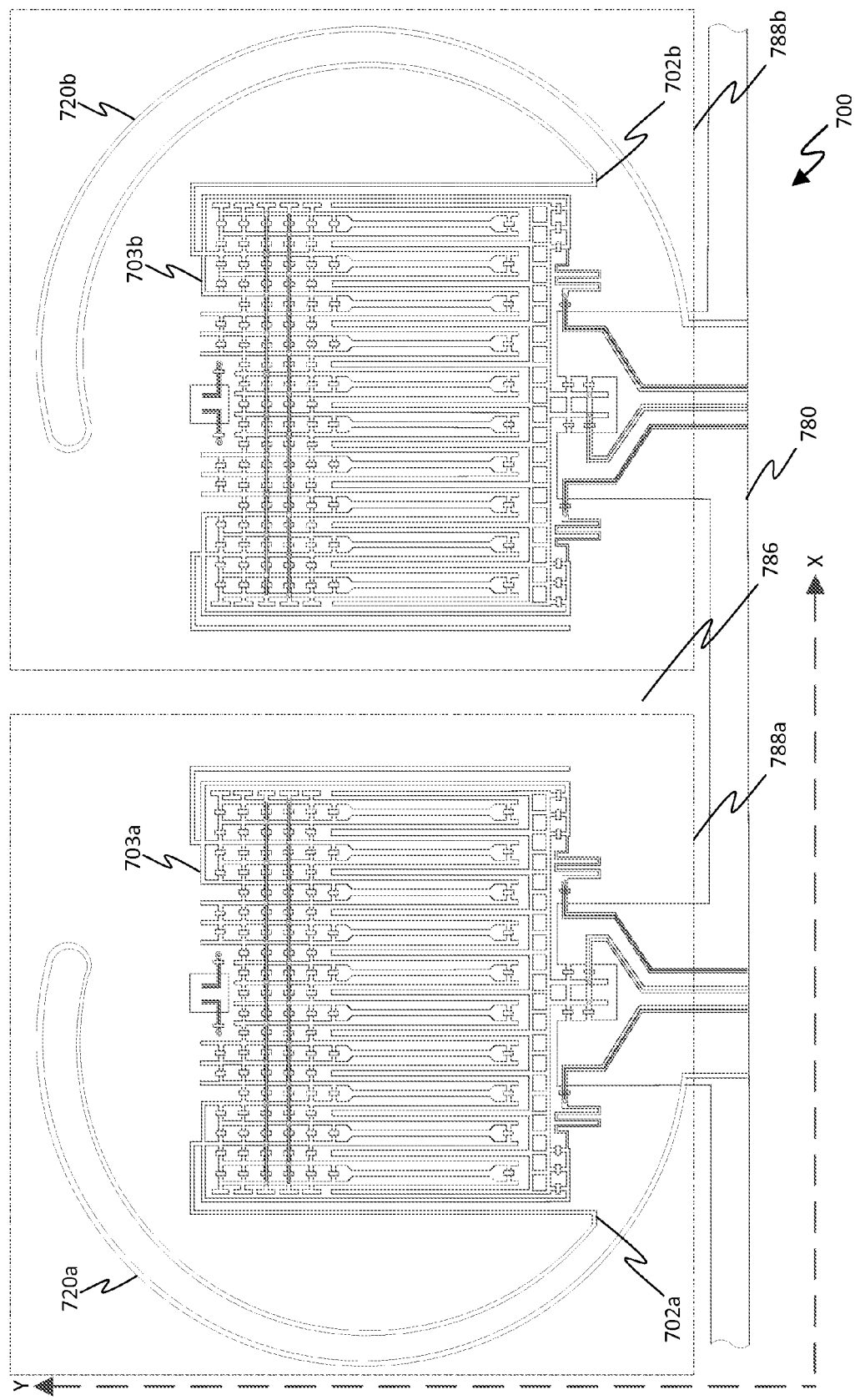

FIG. 7 shows another example pressure sensor 700 that includes two sensing elements 788*a* and 788*b* in accordance with an embodiment described herein. As shown in FIG. 7, pressure sensor 788*a* includes a pressure vessel 720*a* and a corresponding transducer 703*a*, which are mechanically coupled by an intermediate structural element 702*a*. Pressure sensor 788*b* includes a pressure vessel 720*b* and a corresponding transducer 703*b*, which are mechanically coupled by an intermediate structural element 702*b*. Pressure vessels 720*a* and 720*b*, transducers 703*a* and 703*b*, and intermediate structural elements 702*a* and 702*b* (or at least a portion thereof) are suspended in a cavity 786 that is etched out of a semiconductor substrate 780. Each of transducers 703*a* and 703*b* is shown to include two concentric semicircular portions for illustrative purposes and is not intended to be limiting. Each of the semicircular portions has a semicircular shape. It will be recognized that each of transducers 703*a* and 703*b* may include any suitable number of semicircular portions (e.g., one, two, three, four, etc.). Moreover, each of transducers 703*a* and 703*b* may have a shape other than one or more semicircular portions.

Sensing element 788*a* is shown in FIG. 7 to be a mirror image of sensing element 788*b* for illustrative purposes, though the scope of the example embodiments is not limited in this respect. In an example embodiment, pressure sensor 700 is configured such that the vessel pressures in respective pressure vessels 720*a* and 720*b* are substantially equal. In accordance with this embodiment, as the vessel pressure increases in pressure vessels 720*a* and 720*b* to be greater than the cavity pressure in cavity 786, pressure vessels 720*a* and 720*b* deform away from each other (e.g., along the X-axis). In further accordance with this embodiment, transducers 703*a* and 703*b* are configured such that a capacitance associated with transducer 703*a* increases and a capacitance associated with transducer 703*b* decreases with the deformation, or vice versa. By taking the difference between the capacitances, the pressure difference between the vessel pressure and the cavity pressure may be determined By taking the sum of the capacitances, acceleration of pressure sensor 700 along the X-axis may be determined.

In FIG. 5, one pressure vessel 520 is shown to be suspended in cavity 586 for non-limiting illustrative purposes. In FIG. 6, two pressure vessels 620*a* and 620*b* are shown to be suspended in cavity 686 for non-limiting illustrative purposes. In FIG. 7, two pressure vessels 720*a* and 720*b* are shown to be suspended in cavity 786 for non-limiting illustrative purposes. It will be recognized that any suitable number of pressure vessels may be suspended in each of cavities 586, 686, and 786.

In some example embodiments, a lid covers cavity 586, 686, or 786. The lid may be any suitable material, such as another wafer or portion thereof. For instance, the wafer or portion thereof that forms the lid may be electrically isolated from other electrically conductive elements in respective pressure sensor 500, 600, or 700 by a layer of isolation. In one example embodiment, the lid seals cavity 586, 686, or 786 in a vacuum to provide a designated pressure in cavity 586, 686, or 786. For example, the designated pressure may be approximately zero atmospheres. In accordance with this example, the designated pressure may be in a range of 0.0-0.01 atmospheres, 0.0-0.05 atmospheres, 0.0-0.1 atmospheres, etc. For instance, if the designated pressure is approximately zero atmospheres, pressure sensor 500, 600, or 700 may be insensitive to changes of temperature. In another example embodiment, the lid seals cavity 586, 686, or 786 to provide a designated pressure of approximately one atmosphere. For instance, the designated pressure may be in a range of 0.99-1.01 atmospheres, 0.95-1.05 atmospheres, 0.9-1.1 atmospheres, etc.

The designated pressure may be determined at a time instance at which the lid is placed on pressure vessel 500, 600, or 700. It will be recognized that bonding of the lid may be performed at a relatively high temperature. Thus, during cooling, a value of the designated pressure may decrease from a value at the time instance at which the lid is placed on pressure vessel 500, 600, or 700 in accordance with a pressure vs. temperature relationship. It will also be recognized that if the lid seals cavity 586, 686, or 786 in a vacuum, the designated pressure does not change during the cooling.

Figure 8A:
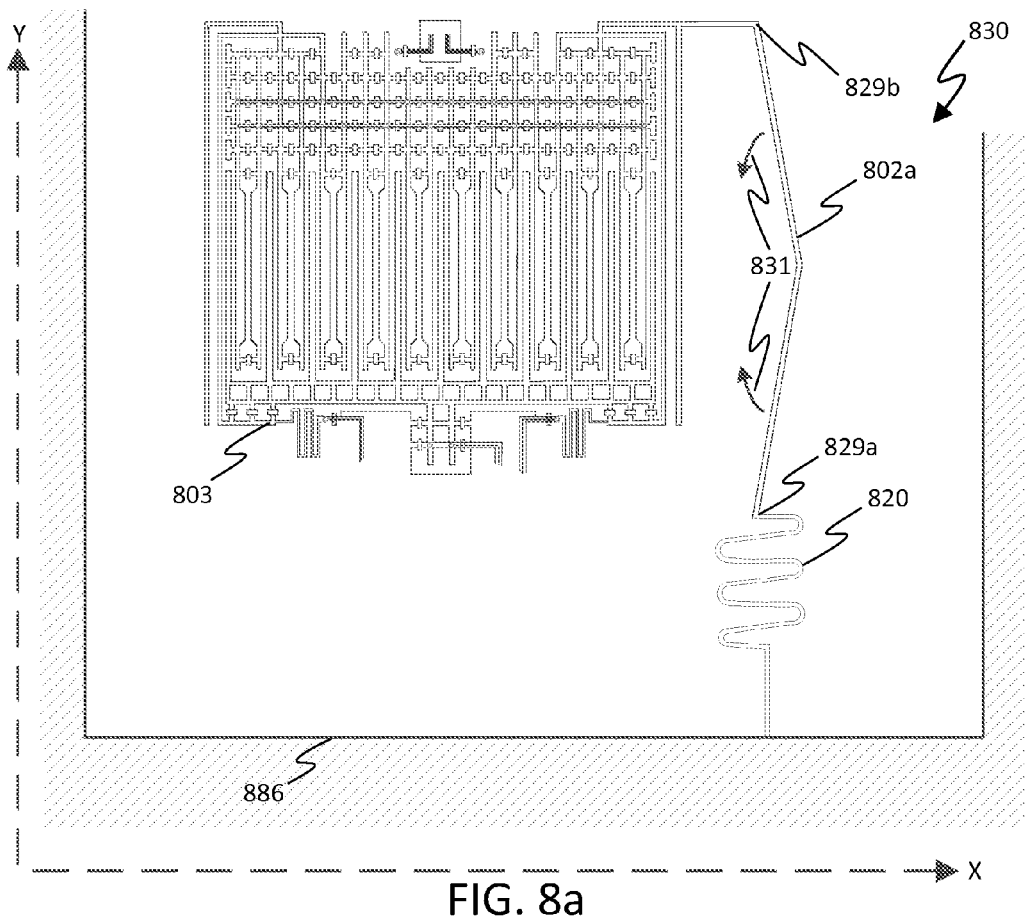
FIGS. 8a-8c show example pressure sensors having respective coupling arrangements in accordance with embodiments described herein.
Figure 8B:
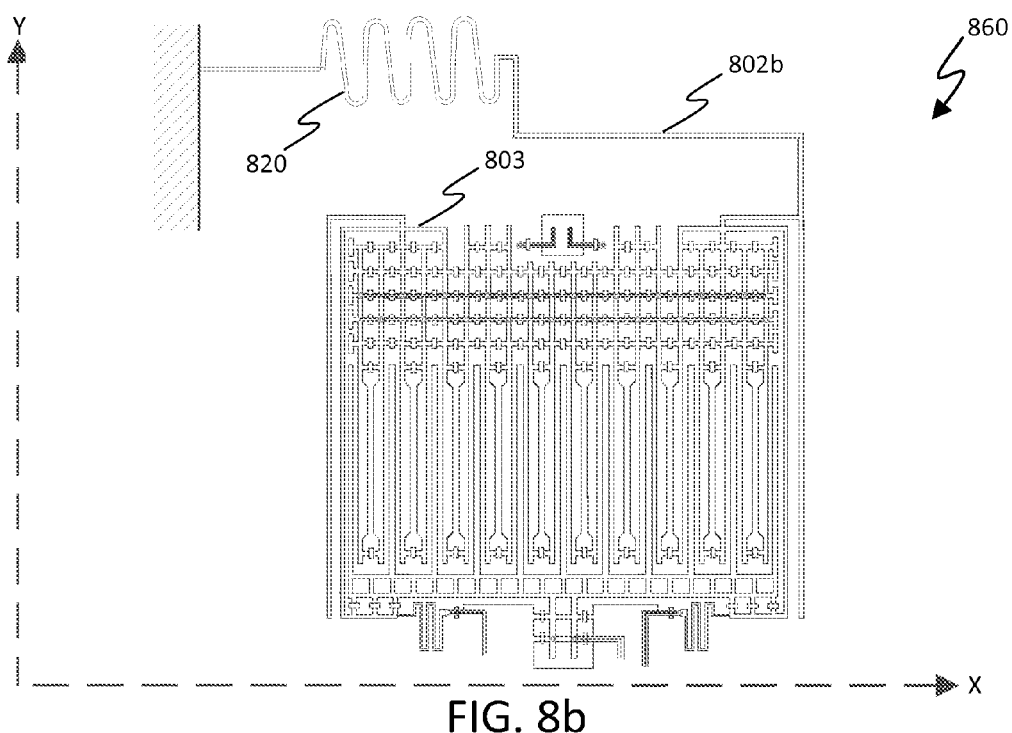
Figure 8C:
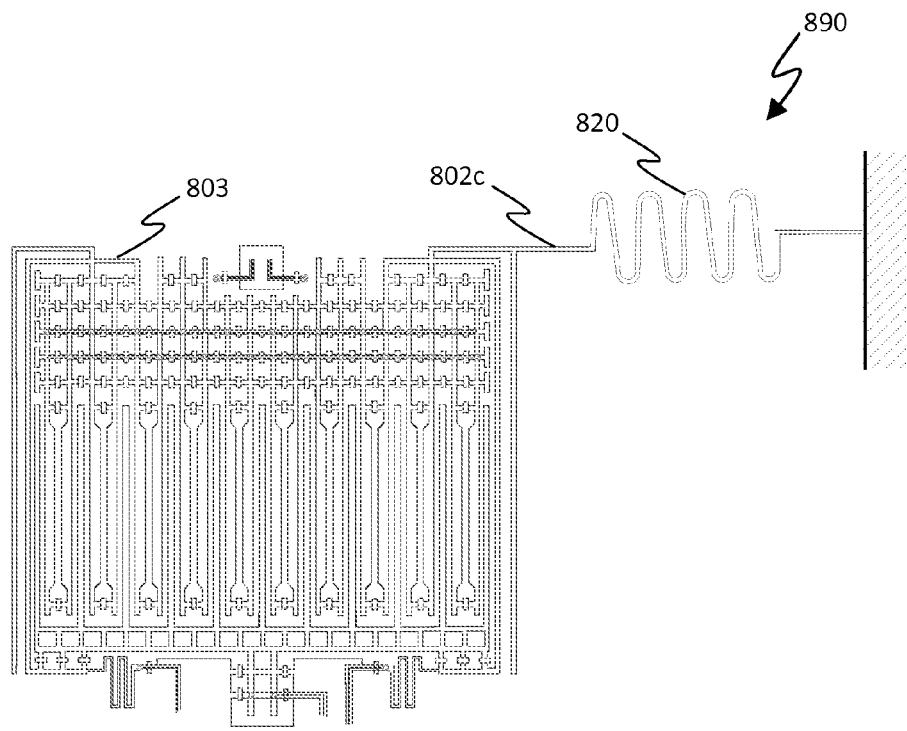

FIGS. 8a-8c show example pressure sensors 830, 860, and 890 having respective coupling arrangements in accordance with embodiments described herein. As shown in FIG. 8a, pressure sensor 830 includes a pressure vessel 820, which is suspended in a cavity 886. Pressure vessel 820 is mechanically coupled to a transducer 803 by an intermediate structural element 802a. Intermediate structural element 802a has a "V" shape. When the vessel pressure in pressure vessel 820 becomes greater than the cavity pressure in cavity 886, pressure vessel deforms, extending in the positive Y-direction. The extension of pressure vessel 820 in the positive Y-direction exerts a force against intermediate structural element 802a at connection point 829a. The exertion of the force at connection point 829a causes intermediate structural element 802a to compress (e.g., fold), as depicted by arrows 831. The compression of intermediate structural element 802a causes a force to be exerted in the negative X-direction against transducer 803 at connection point 829b.

The work that goes into intermediate structural element 802a equals the work that goes out of intermediate structural element 802a. Thus, Win=Fin*din=Wout=Fout*dout, wherein Win is the work in; Wout is the work out; Fin is the force exerted by pressure vessel 820 at connection point 829a; din is the distance that connection point 829a moves in the positive Y-direction; Fout is the force exerted by intermediate structural element 802a at connection point 829b; and dout is the distance that connection point 829b moves in the negative X-direction. In an example embodiment, a stiffness of pressure vessel 820 and a stiffness of transducer 803 are set to cause dout to be greater than din. In accordance with this embodiment, a relatively small movement of connection point 829a results in a relatively large movement of connection point 829b, such that intermediate structural element 802a acts as a motion amplifier. In another example embodiment, a stiffness of pressure vessel 820 and a stiffness of transducer 803 are set to cause dout to be less than din. In accordance with this embodiment, a relatively large movement of connection point 829a results in a relatively small movement of connection point 829b, such that intermediate structural element 802a acts as a motion de-amplifier.

Intermediate structural element 802b is described as responding to a motion in a first direction by causing another motion in a second direction that is perpendicular to the first direction for illustrative purposes and is not intended to be limiting. It will be recognized that an intermediate structural element (e.g., intermediate structural element 802b) may amplify or de-amplify a first motion in a specified direction by causing a second motion in the specified direction that is an amplified version of the first motion.

As shown in FIG. 8b, pressure sensor 860 includes pressure vessel 820, which is mechanically coupled to transducer 803 by an intermediate structural element 802b. Intermediate structural element 802b is configured to be relatively stiff in the X-direction and relatively compliant in the Y-direction. Accordingly, intermediate structural element 802b has anisotropic stiffness (i.e., different stiffness in at least two orthogonal directions) and anisotropically couples pressure vessel 820 to transducer 803. Configuring intermediate structural element 802b to be compliant in a designated direction (e.g., the Y-direction in this example) may hinder (e.g., reduce) package stress issues and/or effects from a coefficient of thermal expansion (CTE) mismatch between material(s) used to fabricate pressure vessel 820 and material(s) used to fabricate transducer 803.

Stiffness of an intermediate structural element (e.g., intermediate structural element 802b) in a designated direction may be reduced for any of a variety of reasons. For example, if the intermediate structural element is pushed in a designated direction, and it is not desired for the intermediate structural element to respond in that direction, the stiffness of the intermediate structural element in that direction may be reduced. In another example, if a relatively large distance exists between two points, the stiffness of the intermediate structural element along an axis that is defined by those points may be reduced. In yet another example, if thermal effects cause a deformation of the pressure vessel in a specified direction in which response is not desired, the stiffness of the intermediate structural element in that direction may be reduced.

As shown in FIG. 8c, pressure sensor 890 includes pressure vessel 820, which is mechanically coupled to transducer 803 by an intermediate structural element 802c. Intermediate structural element 802c directly couples pressure vessel 820 to transducer 803. Accordingly, transducer 803 moves directly with deformation of pressure vessel 820.

Figure 9:
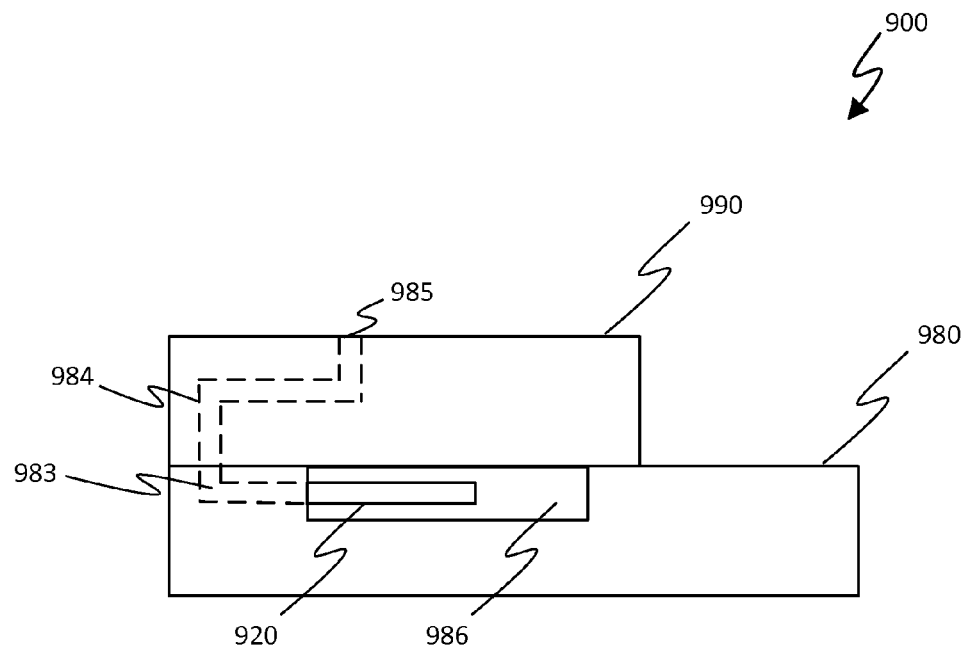
FIG. 9 is a side view of a pressure sensor in accordance with an embodiment described herein.

A pressure that is to be measured may enter a pressure sensor in any of a variety of ways. For example, a pressure vessel may be routed to a vessel pressure port on a side of a wafer, and the pressure may enter the pressure sensor through the vessel pressure port. For instance, the vessel pressure port may be formed when the pressure sensor is singulated (e.g., sawed) to physically detach the pressure sensor from other pressure sensors that are formed in the wafer. In another example, a pressure channel may be routed through a lid that is placed on the wafer to provide a pressure port on top of the lid (e.g., rather than routing the pressure channel to a pressure port on the side of the wafer). FIG. 9 illustrates one example implementation in which a pressure channel is routed through a lid of a pressure sensor to a pressure port on top of the lid.

In particular, FIG. 9 is a side view of a pressure sensor 900 in accordance with an embodiment described herein. Pressure sensor 900 includes a substrate 980 (e.g., a sense wafer) and a lid 990 (e.g., a capping wafer), which caps substrate 980. Substrate 980 includes a cavity 986 in which a pressure vessel 920 is shown to be suspended. Pressure vessel 920 interfaces to an ambient pressure port 985 via an embedded pressure vessel 983 and a channel 984 in lid 990. For instance, ambient pressure port 985 may be created to connect to an ambient pressure that is to be measured. A change of direction of silicon channel 984, as shown in FIG. 9, may be accomplished by bonding two etched wafers together. The purpose of showing the direction change is to indicate that a location of ambient pressure port 985 may be placed as needed on lid 990 and is not restricted to the location vertically above the connection to embedded pressure vessel 983. Furthermore, multiple pressure vessels may be constructed with multiple ambient ports in order to create an array of pressure sensors.

Figure 10:
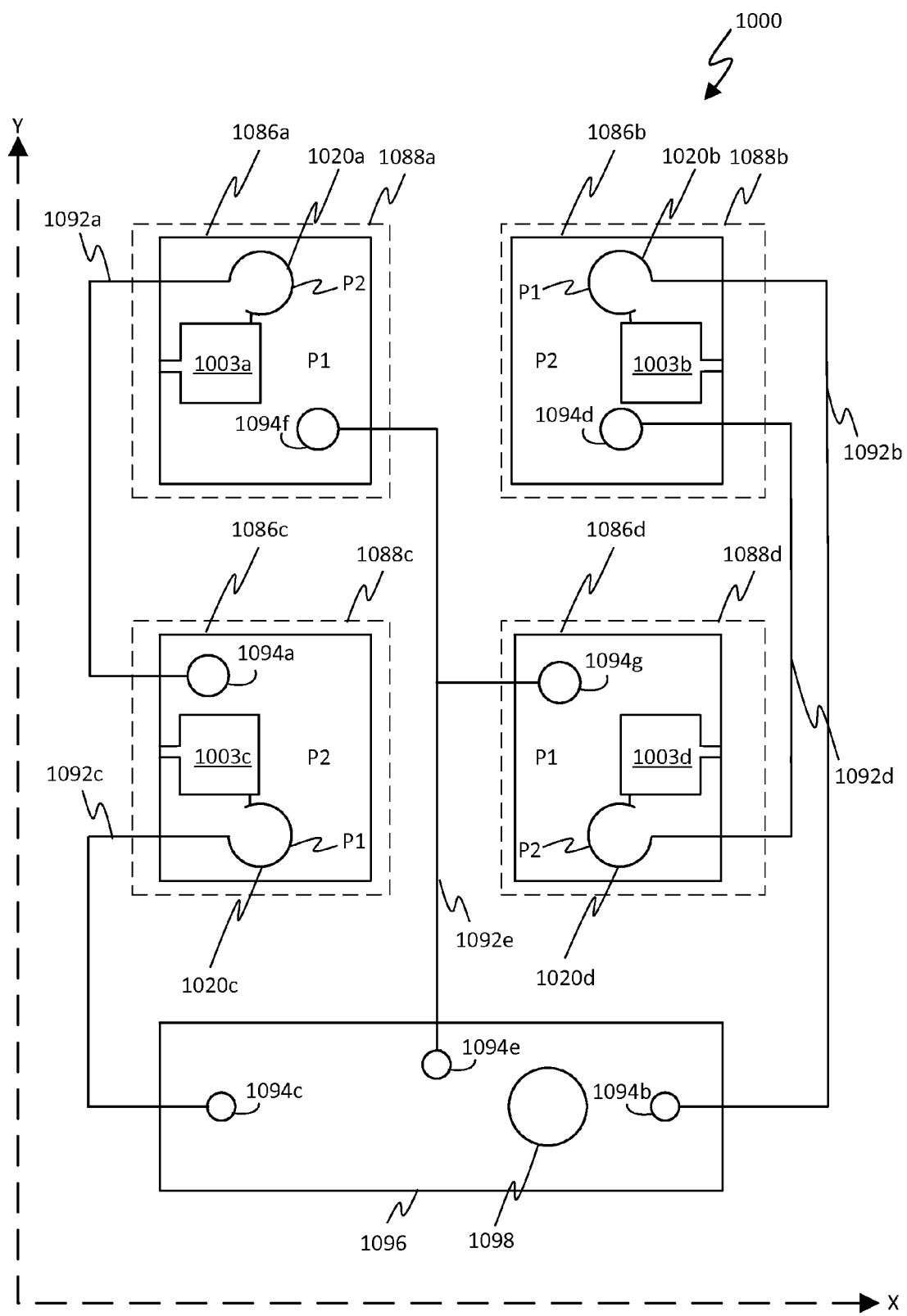
FIG. 10 is a simplified top view of a multi-cavity pressure sensor in accordance with an embodiment described herein.

FIG. 10 is a simplified top view of a multi-cavity pressure sensor 1000 in accordance with an embodiment described herein. Pressure sensor 1000 includes a first sensing element 1088a, a second sensing element 1088b, a third sensing element 1088c, and a fourth sensing element 1088d. First sensing element 1088a includes a first cavity 1086a and a first pressure vessel 1020a, which is suspended in first cavity 1086a. Second sensing element 1088b includes a second cavity 1086b and a second pressure vessel 1020b, which is suspended in second cavity 1086b. Third sensing element 1088c includes a third cavity 1086c and a third pressure vessel 1020c, which is suspended in third cavity 1086c. Fourth sensing element 1088d includes a fourth cavity 1086d and a fourth pressure vessel 1020d, which is suspended in fourth cavity 1086d.

A first pressure, P1, is shown to be in second and third pressure vessels 1020b and 1020c and in first and fourth cavities 1086a and 1086d (but external to first and fourth pressure vessels 1020a and 1020d). A second pressure, P2, is shown to be in first and fourth pressure vessels 1020a and 1020d and in second and third cavities 1086b and 1086c (but external to second and third pressure vessels 1020b and 1020c). Accordingly, first sensing element 1088a and fourth sensing element 1088d have a similar configuration. Second sensing element 1088b and third sensing element 1088c have a similar configuration.

First, second, third, and fourth sensing elements 1088a-1088d are configured as described above to compensate for (e.g., cancel) gradients in processing in the X-direction and in the Y-direction, as shown in FIG. 10. For instance, if a gradient exists in the X-direction (e.g., if slightly more metal is deposited per unit area in a region having a relatively large Y-value as compared to a region having a relatively small Y-value), the aforementioned configurations of first, second, third, and fourth sensing elements 1088a-1088d compensate for such gradient. Likewise, if a gradient exists in the Y-direction (e.g., etching is greater in a region having a relatively small X-value as compared to a region having a relatively large X-value), the aforementioned configurations compensate for such gradient.

Pressure sensor 1000 includes first, second, third, fourth, and fifth transport vessels 1092a, 1092b, 1092c, 1092d, and 1092e, each of which is configured as a pressure vessel for illustrative purposes. Transport vessels 1092a-1092e are configured in a plane of a wafer on which pressure sensing elements 1088a-1088d are fabricated. The plane of the wafer is defined by an X-axis and a Y-axis as shown in FIG. 10. First transport vessel 1092a is connected between first pressure vessel 1020a and third cavity 1086c. A portion of first transport vessel 1092a is removed to provide an opening 1094a in third cavity 1086c, which exposes an environment in first pressure vessel 1020a to an environment in third cavity 1086c. Second transport vessel 1092b is connected between second pressure vessel 1020b and manifold 1096. A portion of second transport vessel 1092b is removed to provide an opening 1094b in manifold 1096, which exposes an environment in second pressure vessel 1020b to an environment in manifold 1096.

Third transport vessel 1092c is connected between third pressure vessel 1020c and manifold 1096. A portion of third transport vessel 1092c is removed to provide an opening 1094c in manifold 1096, which exposes an environment in third pressure vessel 1020c to the environment in manifold 1096. Fourth transport vessel 1092d is connected between fourth pressure vessel 1020d and second cavity 1086b. A portion of fourth transport vessel 1092d is removed to provide an opening 1094d in second cavity 1086b, which exposes an environment in fourth pressure vessel 1020d to an environment in second cavity 1086b.

Fifth transport vessel 1092e is connected between first cavity 1086a, fourth cavity 1086d, and manifold 1096. A first portion of fifth transport vessel 1092e is included in manifold 1096. A second portion of fifth transport vessel 1092e is included in first cavity 1086a. A third portion of fifth transport vessel 1092e is included in fourth cavity 1086d. A part of the first portion of fifth transport vessel 1092e is removed to provide an opening 1094e in manifold 1096. A part of the second portion of fifth transport vessel 1092e is removed to provide an opening 1094f in first cavity 1086a. A part of the third portion of fifth transport vessel 1092e is removed to provide an opening 1094g in fourth cavity 1086d. Openings 1094e, 1094f, and 0194g expose the environment in manifold 1096 to the environments in first cavity 1086a and fourth cavity 1086d. An example pressure vessel having an opening is described in greater detail below with reference to FIG. 12.

Pressure measurement port 1098 exposes an environment of manifold 1096 to an environment (e.g., ambient environment) external to pressure sensor 1000. For instance, the first pressure P1 may enter manifold 1096 through pressure measurement port 1098. The first pressure P1 may be ported from manifold 1096 to third pressure vessel 1020c through third transport vessel 1092c, to second pressure vessel 1020b through second transport vessel 1092b, and to first cavity 1086a and fourth cavity 1086d through fifth transport vessel 1092e. In one example, the first pressure P1 may be a pressure to be measured, and the second pressure P2 may be a reference pressure. In another example, the first pressure P1 may be a reference pressure, and the second pressure P2 may be a pressure to be measured. It will be recognized that openings 1094a-1094g constitute respective vessel pressure ports.

A differential measurement may be performed by comparing the first pressure P1 and the second pressure P2 (e.g., subtracting the first pressure from the second pressure, or vice versa). It will be recognized that multiple sensing elements may be included in each of the cavities 1086a-1086d to increase an amplitude of a signal that represents the difference between the first pressure P1 and the second pressure P2 and/or to increase a signal-to-noise ratio (SNR) associated with the signal.

First sensing element 1088a, second sensing element 1088b, third sensing element 1088c, and fourth sensing element 1088d include a first transducer 1003a, a second transducer 1003b, a third transducer 1003c, and a fourth transducer 1003d, respectively. Sensing elements 1088a-1088d, including their corresponding transducers 1003a-1003d, are shown in FIG. 10 to be configured in a grid having a first diagonal and a second diagonal. For instance, the first diagonal may include a first subset of the transducers 1003a-1003d (e.g., the first and fourth transducers 1003a and 1003d). The second diagonal may include a second subset of the transducers 1003a-1003d (e.g., the second and third transducers 1003b and 1003c). Transducers in the first subset may have first capacitances that increase with an increase of the first pressure P1 (e.g., relative to the second pressure P2). Transducers in the second subset may have second capacitances that decrease with the increase of the first pressure P1. Transducers 1003a-1003d may be configured to provide a differential capacitance based on a difference between the first capacitances and the second capacitances.

Figure 11A:
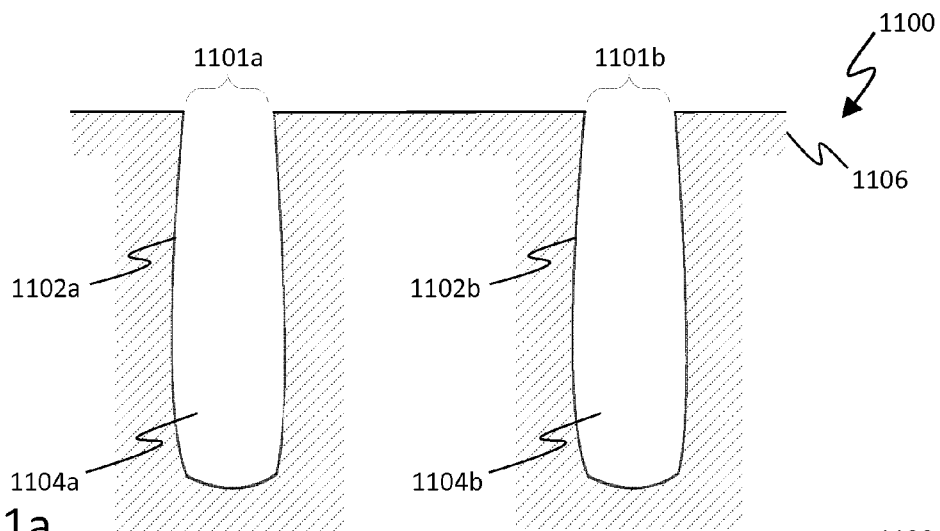
FIGS. 11a-11o show cross-sections of a wafer to illustrate fabrication of a pressure sensor in accordance with embodiments described herein.
Figure 11B:
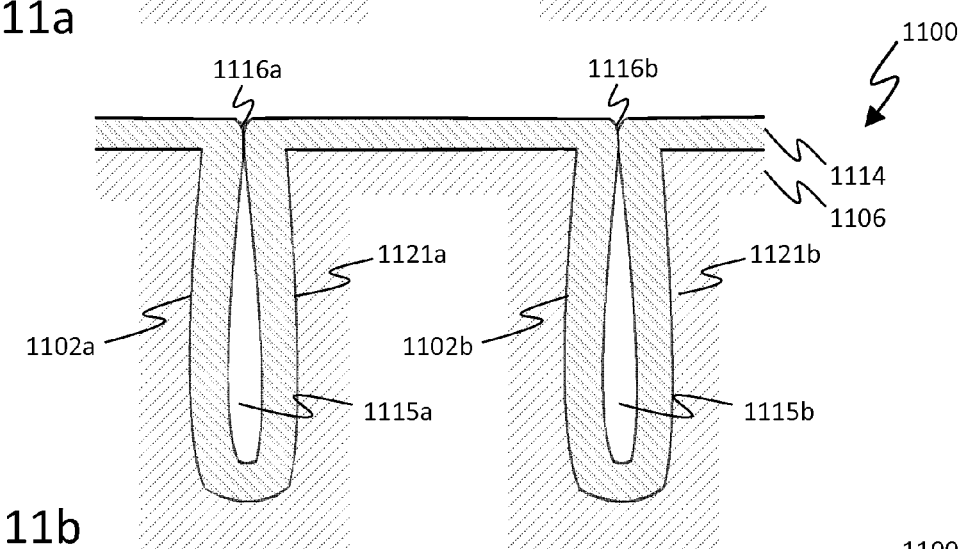
Figure 11C:
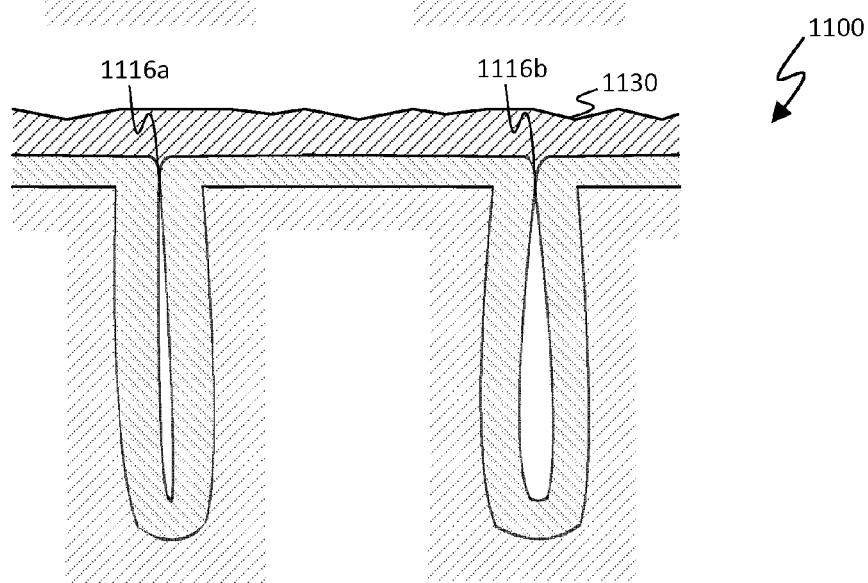
Figure 11D:
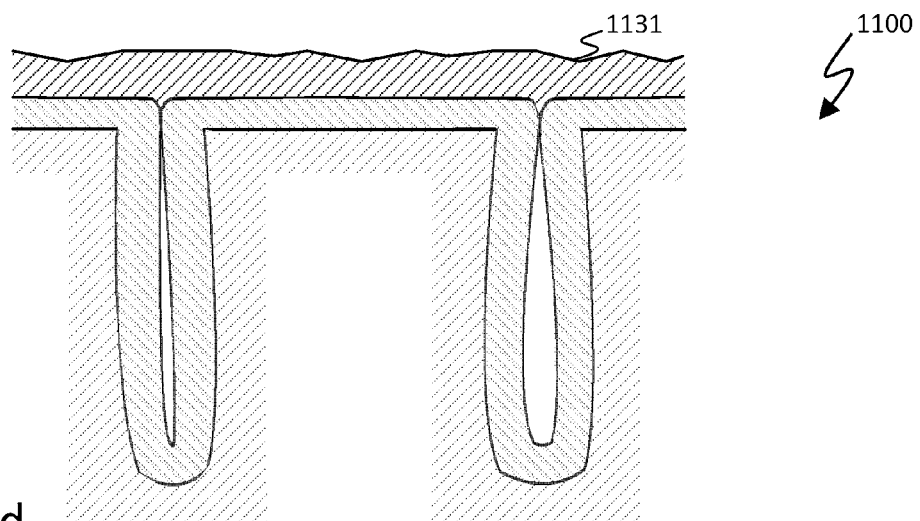
Figure 11E:
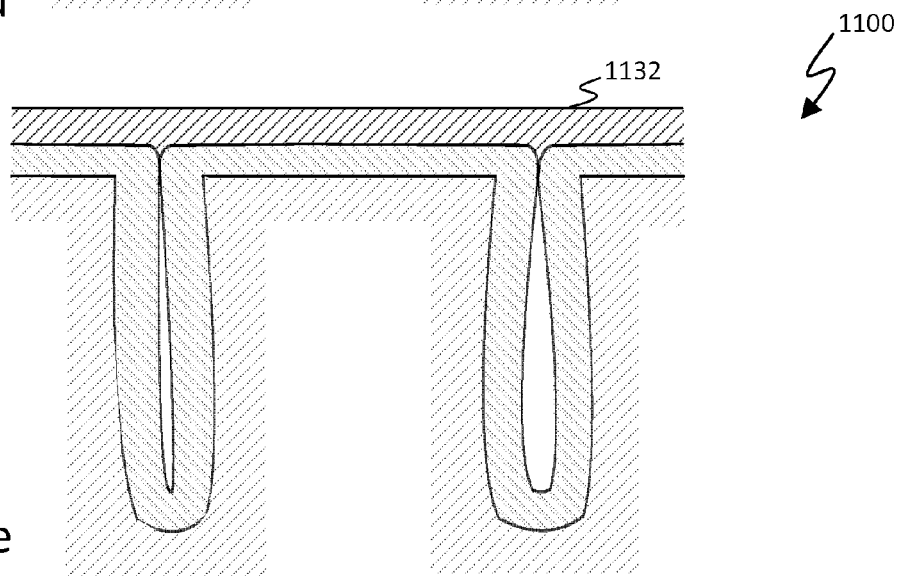
Figure 11F:
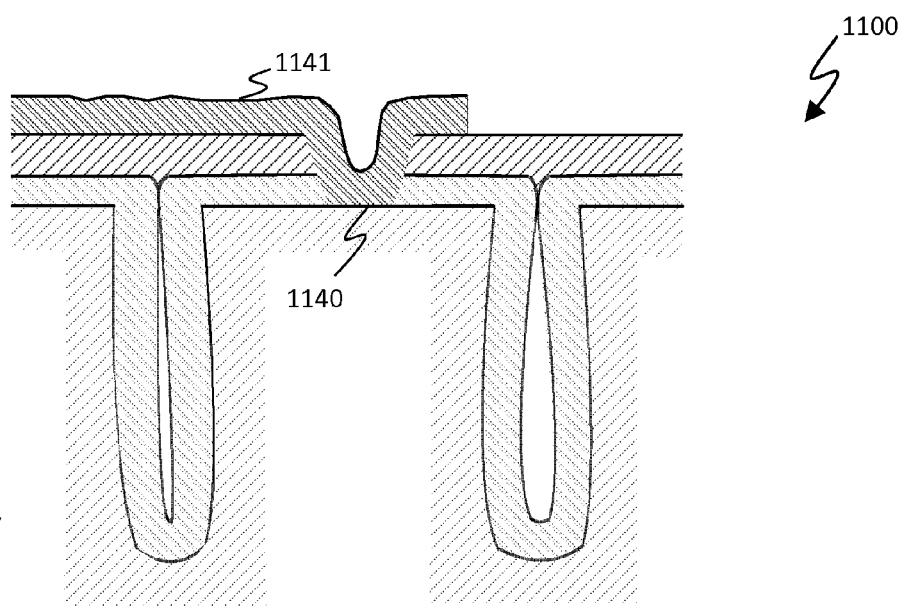
Figure 11G:
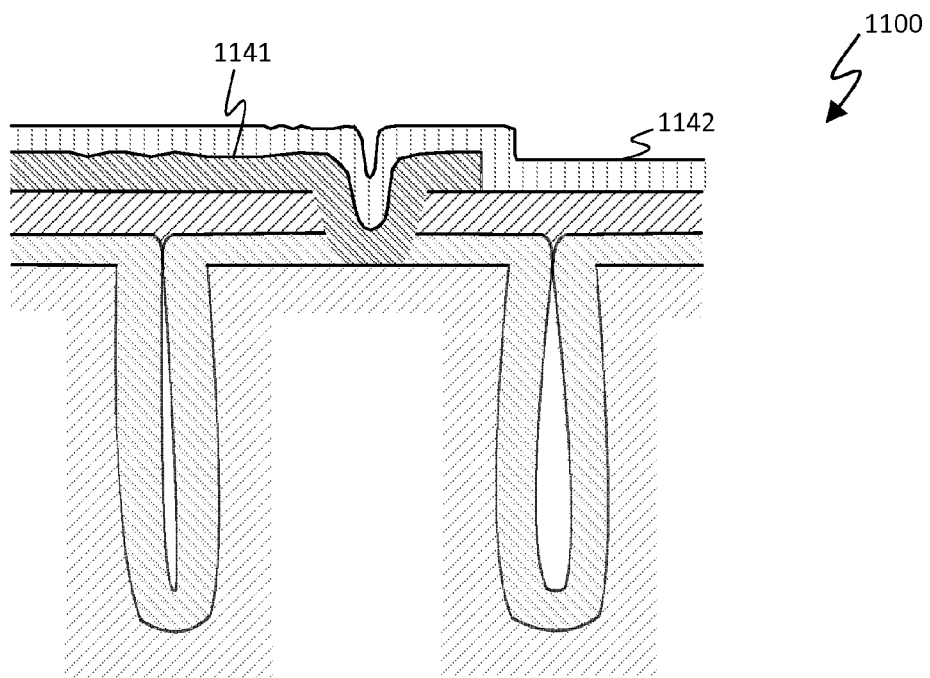
Figure 11H:
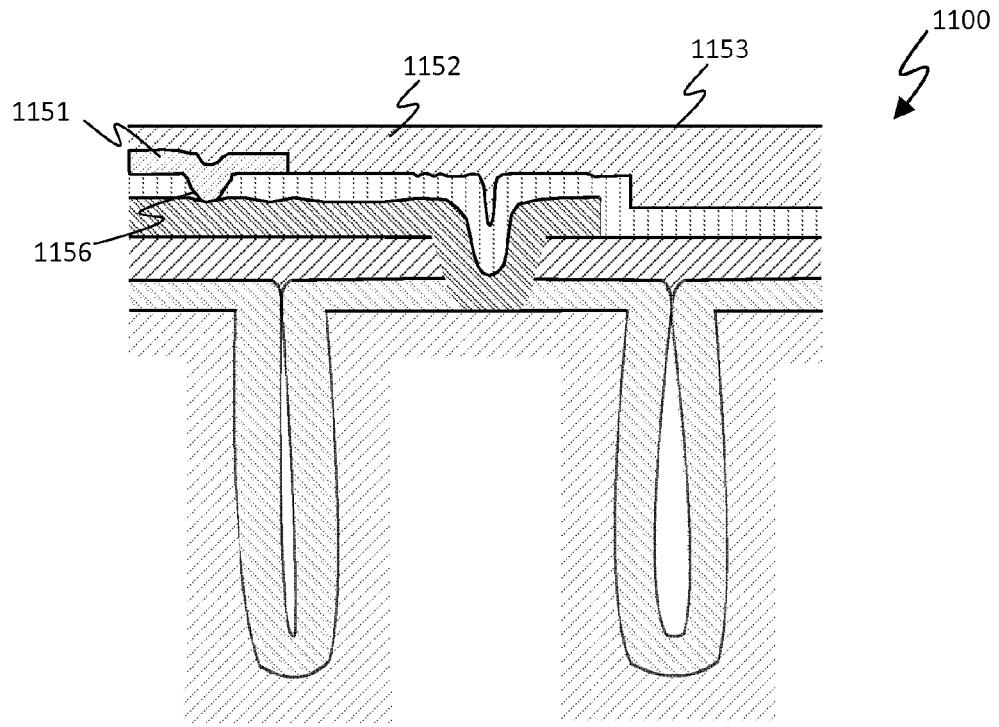
Figure 11I:
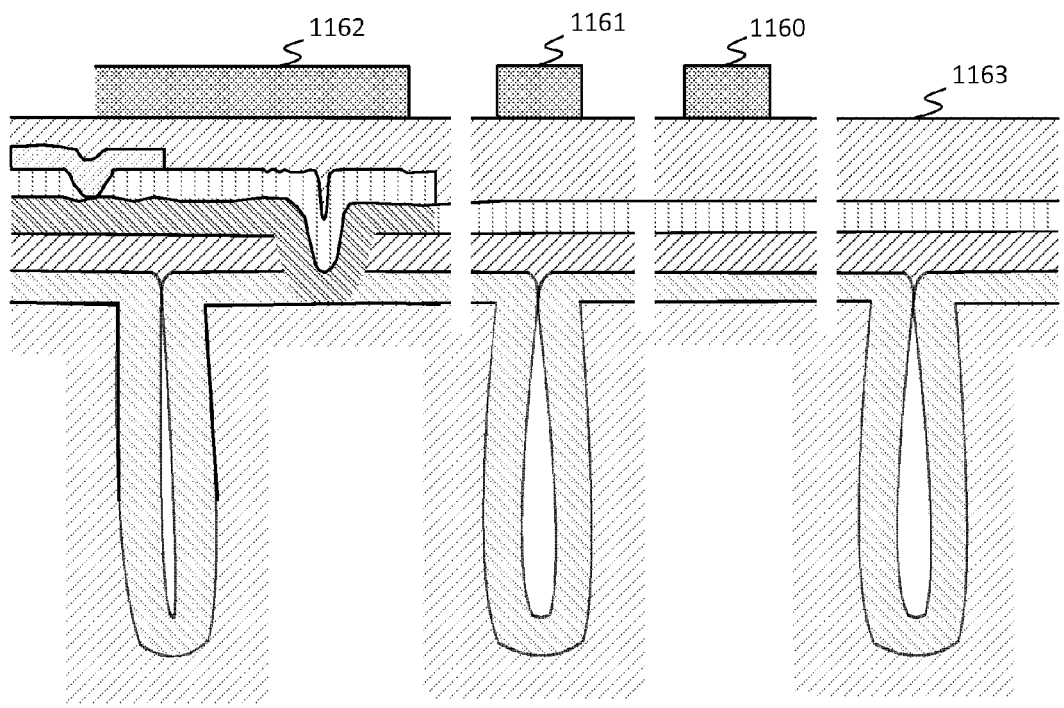
Figure 11J:
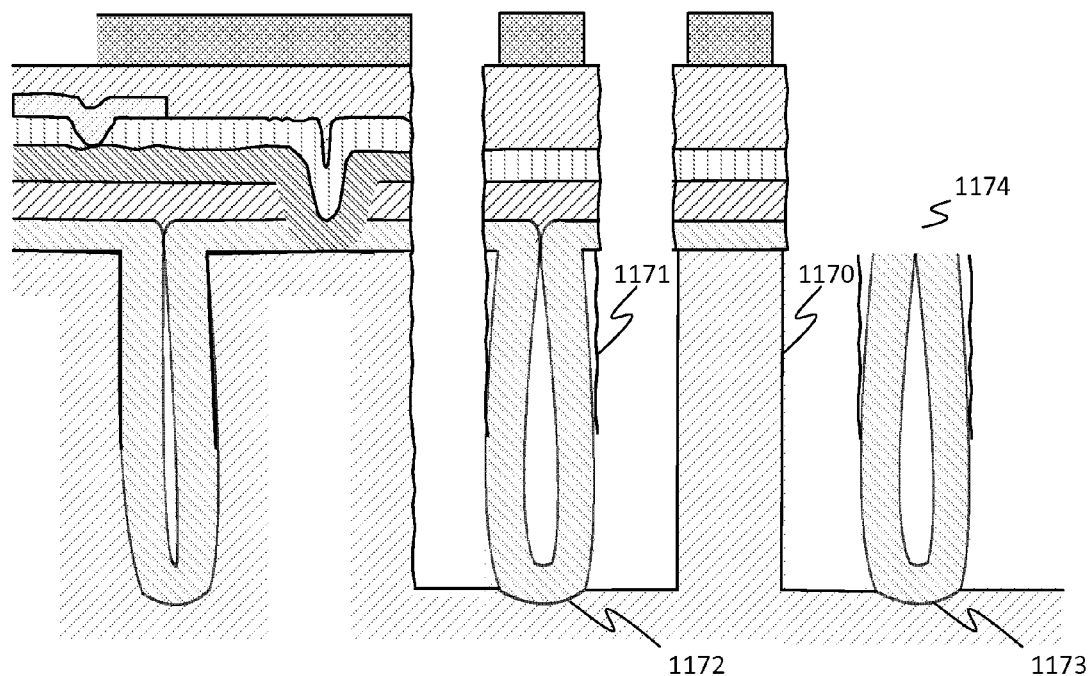
Figure 11K:
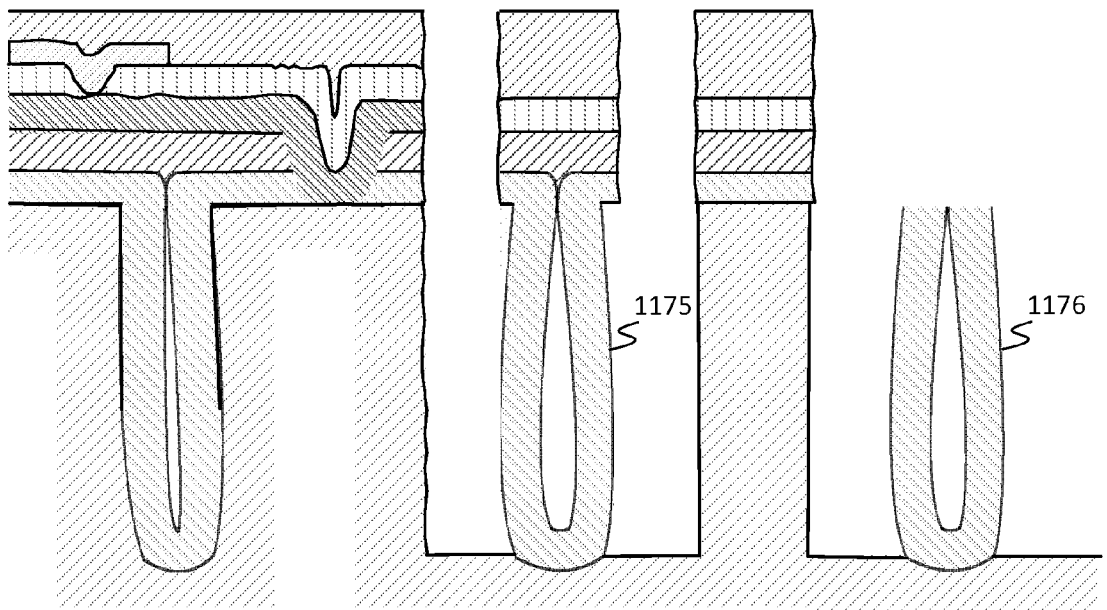
Figure 11L:
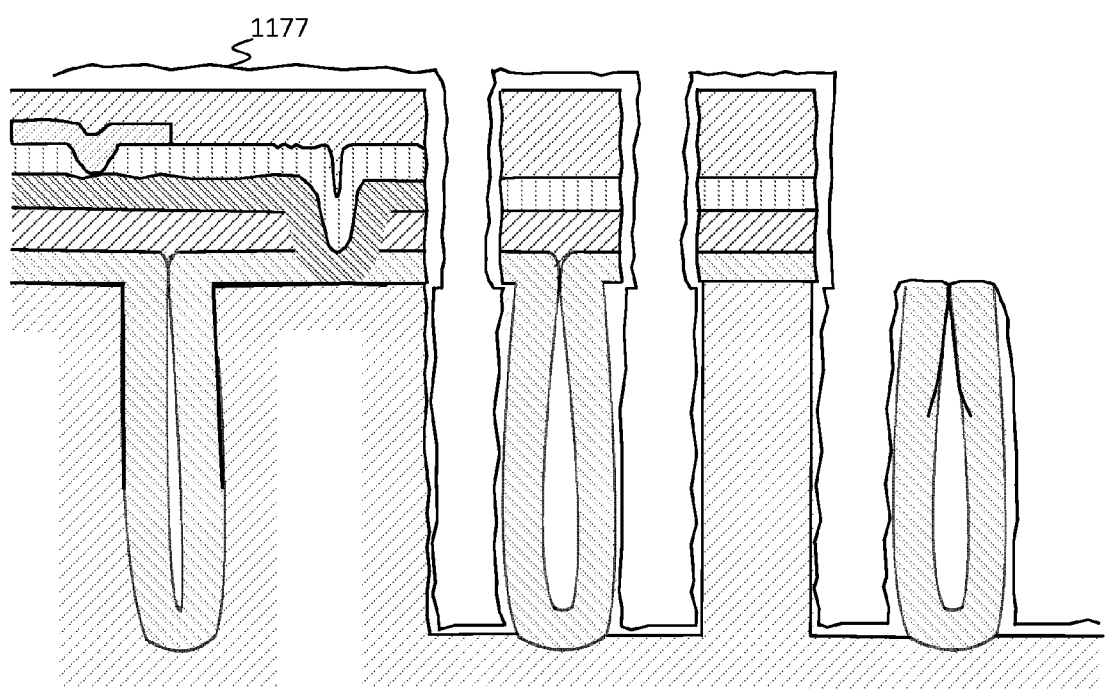
Figure 11M:
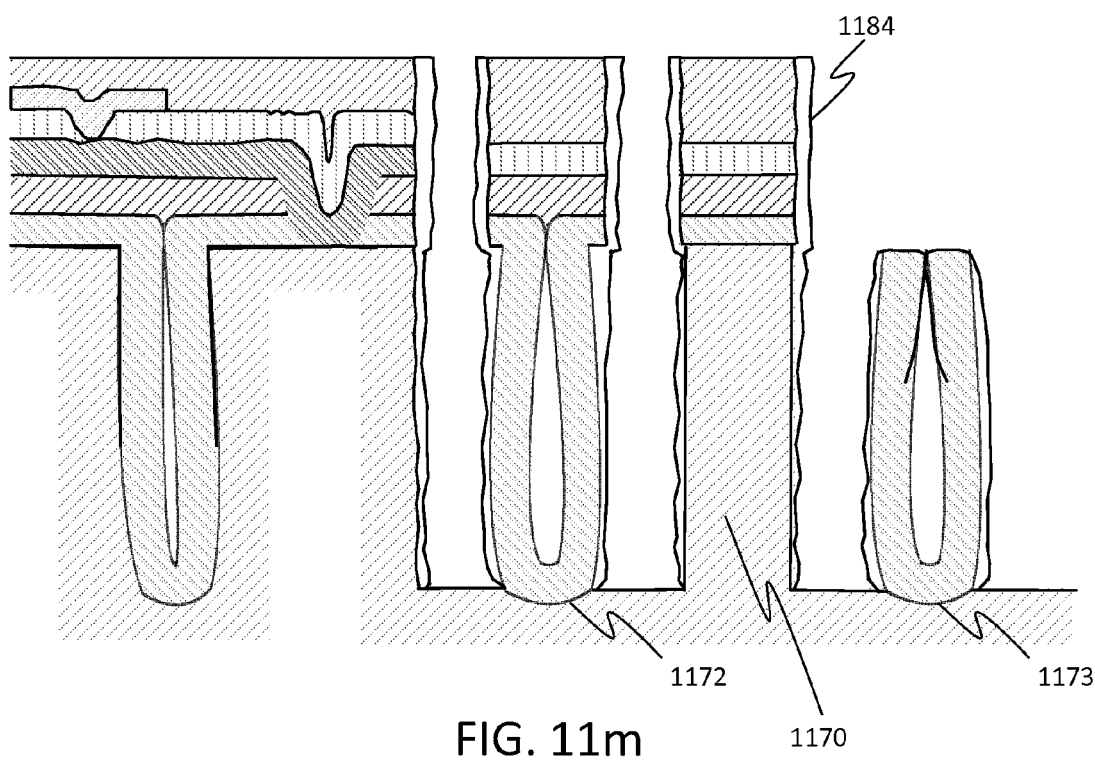
Figure 11N:
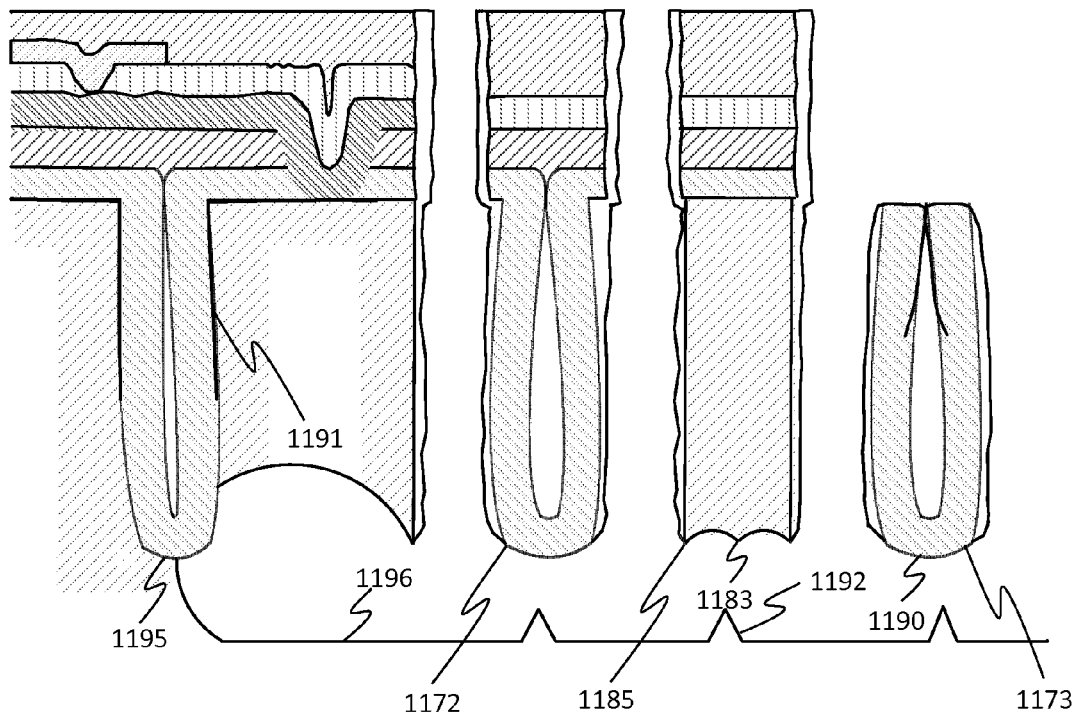
Figure 11O:
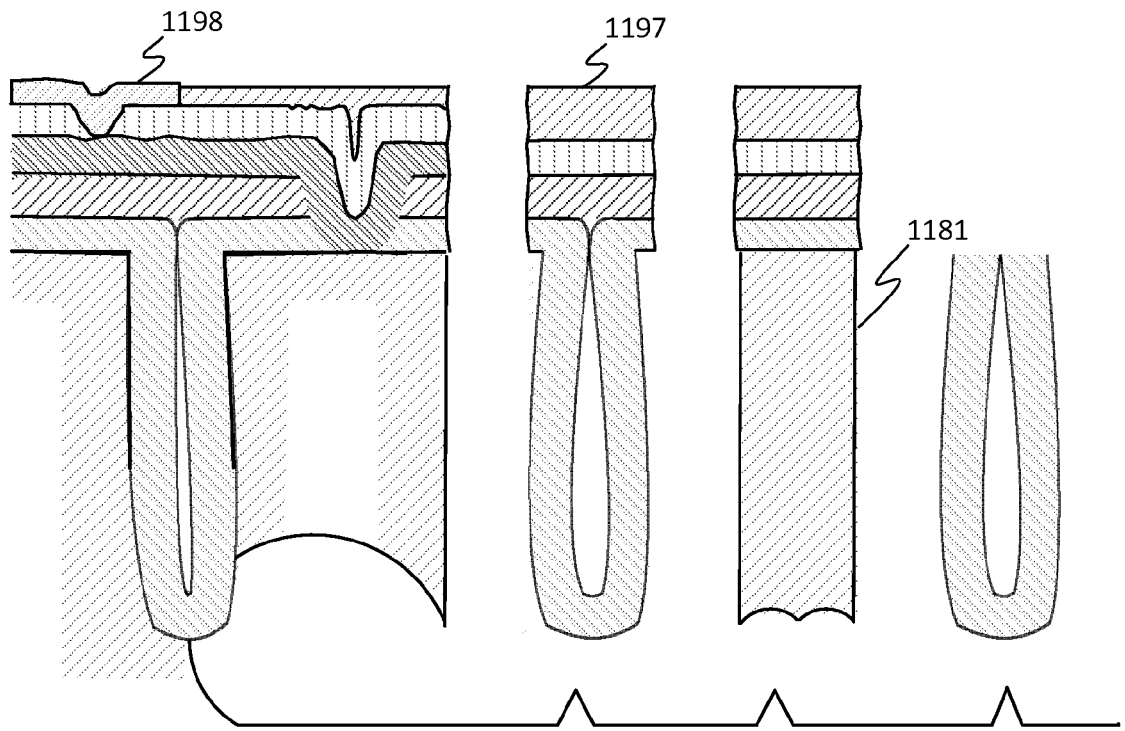

FIGS. 11a-11o show cross-sections of a wafer to illustrate fabrication of a pressure sensor 1100 in accordance with embodiments described herein. As shown in FIG. 11a, fabrication of pressure sensor 1100 starts with a silicon wafer 1106. Using an oxide mask and photolithography, trenches 1102a and 1102b are etched in wafer 1106 in such a manner that respective trench openings 1101a and 1101b are smaller than respective trench bottom widths 1104a and 1104b. The oxide mask may have any suitable thickness (e.g., on the order of 0.5 microns). The oxide mask is stripped off in buffer oxide etch after the silicon etching, resulting in the silicon structure shown in FIG. 11a.

Referring now to FIG. 11b, after wafer 1106 is etched, wafer 1106 is placed in a thermal oxidation furnace at a relatively high temperature (e.g., 1100° C.) long enough to grow a suitable thickness (e.g., approximately 2.2 microns) of thermal oxide. In performing this oxidation, an upper portion of each of the trenches 1102a and 1102b pinches off and forms respective seams 1116a and 1116b, respective sidewall oxides 1121a and 1121b, and top oxide 1114. As shown in FIG. 11b, voids 1115a and 1115b are formed inside respective trenches 1102a and 1102b. Although the tops of trenches are sealed by respective seams 1116a and 1116b, seams 1116a and 1116b are weak points in the structure. Unless oxidations are carried out at higher temperatures than typical quartz furnaces can withstand, the seam does not fuse.

As shown in FIG. 11c, a layer of polysilicon 1130 having a suitable thickness (e.g., a thickness of approximately 0.5 microns) may be deposited to facilitate fusing of seams 1116a and 1116b. Polysilicon 1130 can be deposited undoped using low pressure chemical vapor deposition (LPCVD) or other suitable type of deposition, and the result may be substantially conformal. It will be recognized that seam 1116a need not necessarily fuse or even close off completely during the growth of sidewall oxides 1121a and 1121b if an additional polysilicon layer is deposited. The polysilicon 1130 can both bridge the gap and fuse the seams 1116a and 1116b.

Referring to FIG. 11d, once the wafer is subjected to a second oxidation, the polysilicon 1130 turns into silicon dioxide 1131 thereby sealing seams 1116a and 1116b. If needed, a chemical mechanical polishing step can be used to planarize silicon dioxide 1131 and produce flat surface 1132, as shown in FIG. 11e. The wafer is described as being formed from silicon, and the resulting oxide is described as being silicon dioxide, for illustrative purposes. It will be recognized that the wafer may be formed from any suitable semiconductor material, and the resulting oxide may be any suitable dielectric.

As shown in FIG. 11f, a combination of photolithography and oxide etching may be used to etch a via 1140. Standard silicon contacts (or other type of contacts) can then be made using a subsequent combination of a thin screen oxidation, implantation, buffered oxide etch, aluminum deposition, photolithography, and metal etching. For instance, the aforementioned fabrication processing steps may result in metal (e.g., aluminum) trace 1141.

FIG. 11g shows an intermetallic dielectric (IMD) 1142 deposited conformally over trace 1141 and the adjacent silicon dioxide layers. As shown in FIG. 11h, another aluminum trace 1151 and via 1156 are formed. In this case, the aluminum-to-aluminum interface is simply prepared using an ion beam clean prior to metal deposition. Also shown in FIG. 11h is a top oxide 1152 that is planarized with chemical-mechanical planarization (CMP) to form top flat surface 1153 for illustrative purposes. It will be recognized that the top oxide 1152 need not necessarily be planarized with CMP. In fact, the top oxide 1152 need not necessarily be planarized at all.

In FIG. 11i, developed photoresist patterns 1160, 1161, and 1162 are shown. Photoresist patterns 1160, 1161, and 1162 are created to define silicon mesas, pressure sense elements, and silicon connection points. It should be noted that surface 1163 is not protected by a photoresist pattern. After transferring photoresist patterns 1160, 1161, and 1162 into the underlying silicon using a combination of silicon dioxide etching and deep silicon etching, the structure shown in FIG. 11j results. As shown in FIG. 11j, a top portion of pressure vessel 1173 is etched away because pressure vessel 1173 is not protected by a photoresist pattern. Photoresist patterns 1160, 1161, and 1162 are slightly larger than the underlying structures (e.g., pressure vessel 1172 and silicon connector 1170) they are exposing to allow for typical misalignments in manufacturing. Accordingly, silicon stringers 1171 may result on the sidewalls of pressure vessels 1172 and 1173. By performing a relatively brief isotropic silicon etch using wet and/or dry chemistries, silicon stringers 1171 can be removed. If silicon stringers 1171 are not removed, they may produce unwanted asymmetries and/or unwanted signal changes due to the mismatch in coefficient of thermal expansion (CTE) between silicon stringers 1171 and the underlying silicon dioxide. The result of the isotropic silicon etch should be the clean sidewalls 1175 and 1176 as shown in FIG. 11k.

As shown in FIG. 11l, a conformal layer of silicon dioxide 1177 is deposited using a sputter deposition system. Silicon dioxide 1177 may be deposited using plasma-enhanced chemical vapor deposition (PECVD) silane based depositions or tetraethyl orthosilicate (TEOS) based depositions, for example. By performing a subsequent anisotropic etch of the silicon dioxide to remove all horizontal surfaces of silicon dioxide, the device shown in FIG. 11m results. Remaining silicon dioxide sidewall 1184 coats the sides of silicon connector 1170 and pressure vessels 1172 and 1173.

FIG. 11n shows a cross section of the wafer after an isotropic silicon release is performed in an SF6 plasma. Note that the bottom 1195 of isolation trench 1191 and the underside 1190 of pressure vessels 1172 and 1173 are clear of silicon. Etch artifacts 1192 result on silicon substrate floor 1196 under each structure (i.e., silicon beam 1185 and pressure vessels 1172 and 1173). A similar artifact 1183 results on the underside of silicon beam 1185.

As shown in FIG. 11o, the fabrication sequence may conclude with a relatively brief Primaxx® etch to remove the sidewall oxides. For instance, removal of the sidewall oxides results in clean silicon sidewall 1181. Furthermore, the Primaxx® etch also etches top oxide 1197 enough to expose metal layer 1198. Exposing metal layer 1198 is useful in providing both bonding pads and a seal ring for subsequent wafer scale lid bonding processes.

FIGS. 11a-11o have been described with reference to a standard silicon wafer for illustrative purposes and are not intended to be limiting. As one skilled in the art is well aware, variations that use silicon on insulator or epitaxial silicon deposited on oxide are within the scope of the embodiments described herein. It will be recognized that making the pressure sensor out of a standard silicon wafer may be desirable for cost reasons.

It will be recognized that both pressure vessel(s) and transducer(s) may be fabricated using the elements shown in the cross sections described herein.

Figure 12:
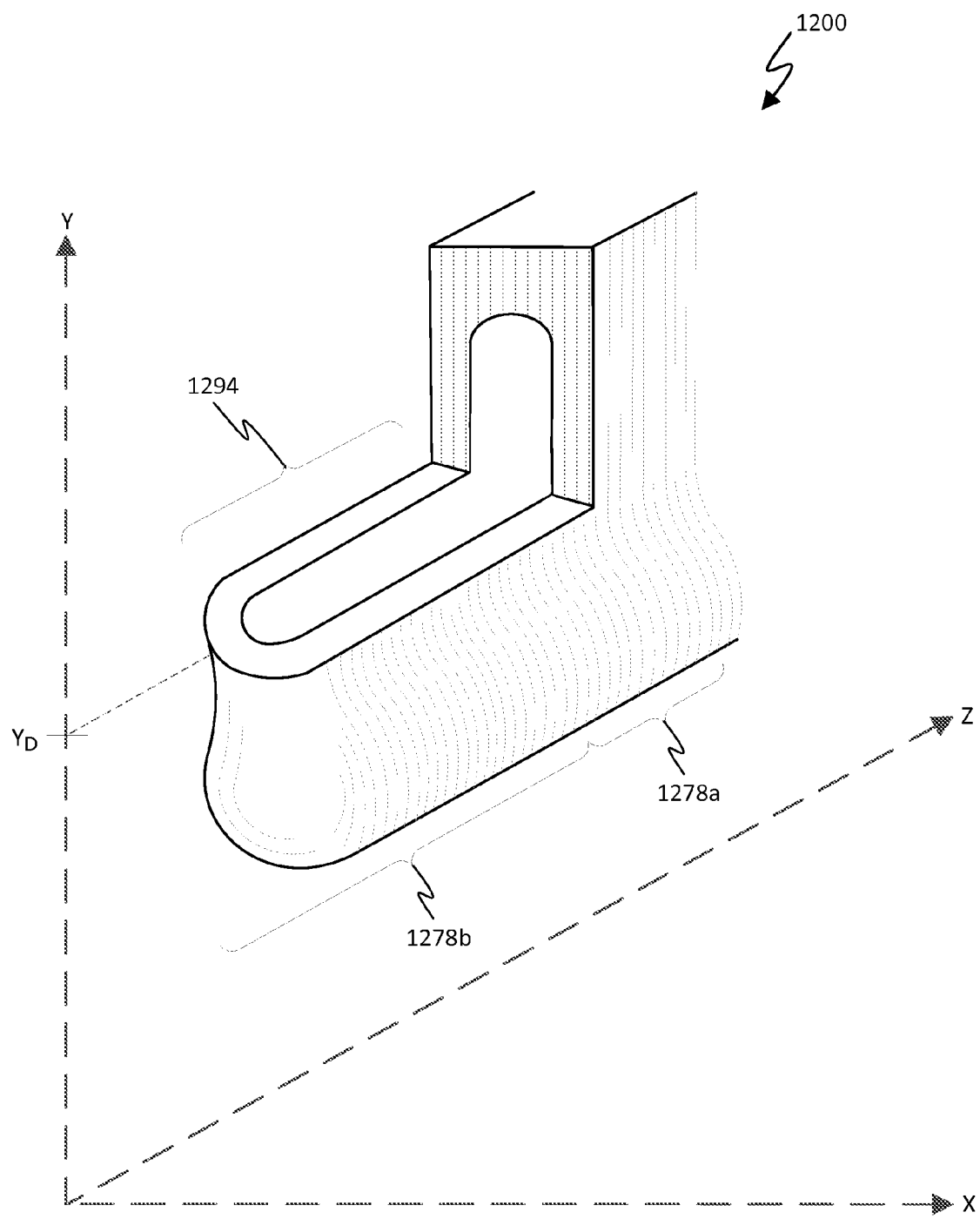
FIG. 12 depicts a pressure vessel having an opening in accordance with an embodiment described herein.

FIG. 12 depicts a pressure vessel 1200 having an opening 1294 in accordance with an embodiment described herein. Pressure vessel 1200 includes a first portion 1278a and a second portion 1278b. As shown in FIG. 12, a top of the second portion 1278b is etched away in an etching step. The top of the second portion 1278b is defined to be a part of the second portion 1178b that resides above a designated Y-value, YD, along the Y-axis shown in FIG. 12. For instance, the top of the second portion 1278b may be etched away as a natural part of a fabrication process that is used to fabricate an inertial sensor, such as an accelerometer or a gyroscope, merely by changing one of the masks that are used in the fabrication process. For instance, referring back to FIG. 11i, a photoresist may be used to define patterns (e.g., 1160, 1161, and 1162) that are to be etched. The patterns are intended to protect the layers that are beneath the patterns. In areas that are not protected by the patterns, etching occurs through the unprotected masking oxides and into the wafer, as illustrated in the transition from FIG. 11*i* to FIG. 11*j*.

Thus, if photoresist is placed over a pressure vessel (e.g., pressure vessel 1200), the oxide underneath the photoresist stays intact, and the pressure vessel is roughly carved out with some residuals (e.g., silicon stringers 1171) left on the sides of the pressure vessel. However, if photoresist is not placed over a pressure vessel (as shown with regard to pressure vessel 1173 in FIG. 11*i*), the top masking oxide is etched away, but the pressure vessel includes so much oxide that a substantial amount of the oxide remains (as shown with regard to pressure vessel 1173 in FIG. 11*j*). Accordingly, by placing photoresist over the first portion 1278*a* of pressure vessel 1200 and not placing photoresist over the second portion 1278*b* of pressure vessel 1200, the top of the second portion 1278*b* may be etched away, leaving opening 1294 in the second portion 1278*b*. It will be recognized that the etching step may etch the wafer around pressure vessel 1200, as well. Opening 1294 is an example implementation of any one or more of openings 1094*a*-1094*g* shown in FIG. 10. Opening 1294 may be referred to as a pressure vessel port.

Figure 13:
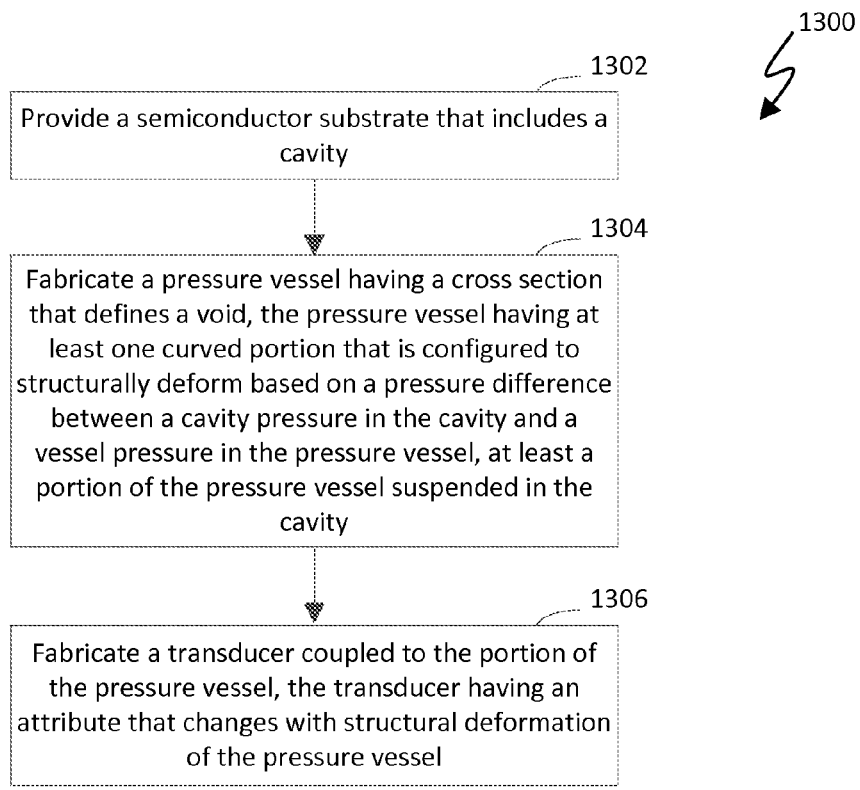
FIG. 13 depicts a flowchart of an example method for fabricating a pressure sensor in accordance with an embodiment described herein.
Figure 14:
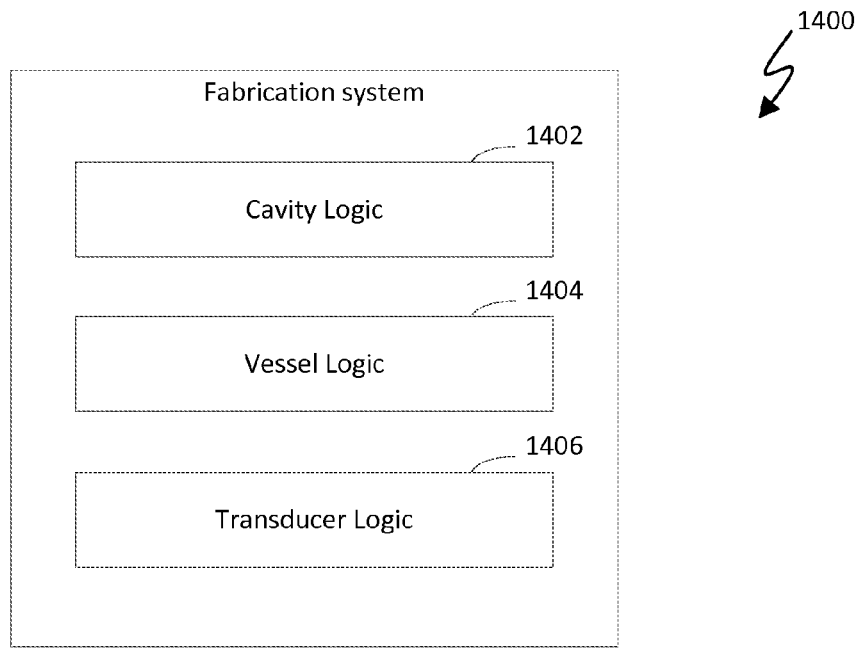
FIG. 14 is a block diagram of an example fabrication system in accordance with an embodiment described herein.

FIG. 13 depicts a flowchart 1300 of an example method for fabricating a pressure sensor in accordance with an embodiment described herein. For illustrative purposes, flowchart 1300 is described with respect fabrication system 1400 shown in FIG. 14. As shown in FIG. 14, fabrication system 1400 includes cavity logic 1402, vessel logic 1404, and transducer logic 1406. Further structural and operational embodiments will be apparent to persons skilled in the relevant art(s) based on the discussion regarding flowchart 1300.

As shown in FIG. 13, the method of flowchart 1300 begins at step 1302. In step 1302, a semiconductor substrate that includes a cavity is provided. In an example implementation, cavity logic 1402 provides the semiconductor substrate that includes the cavity.

At step 1304, a pressure vessel having a cross section that defines a void is fabricated. The pressure vessel has at least one curved portion that is configured to structurally deform based on a pressure difference between a cavity pressure in the cavity and a vessel pressure in the pressure vessel. At least a portion of the pressure vessel is suspended in the cavity. In an example implementation, vessel logic 1404 fabricates the pressure vessel.

In an example embodiment, step 1304 further includes embedding at least a support portion of the pressure vessel in the semiconductor substrate external to the cavity. The support portion physically supports the pressure vessel. For instance, the support portion may enable the pressure vessel to be suspended in the cavity.

At step 1306, a transducer coupled to the portion of the pressure vessel is fabricated. The transducer has an attribute that changes with structural deformation of the pressure vessel. In an example implementation, transducer logic 1406 fabricates the transducer.

In some example embodiments, one or more steps 1302, 1304, and/or 1306 of flowchart 1300 may not be performed. Moreover, steps in addition to or in lieu of steps 1302, 1304, and/or 1306 may be performed. For instance, in an example embodiment, the pressure vessel is fabricated from a dielectric (e.g., a dielectric lining) that is formed during processing of the semiconductor substrate. In accordance with this embodiment, the method of flowchart 1300 may include forming the dielectric on the semiconductor substrate. It will be recognized that any suitable semiconductor processing logic (e.g., oxidation logic) may be used to form the dielectric on the semiconductor substrate. It will be further recognized that the pressure vessel may be fabricated from material(s) other than a dielectric. For instance, the pressure vessel may be fabricated from silicon, rather than a dielectric; however, a channel etched in silicon is likely to be relatively large, and alignment to the silicon may be challenging.

It will be recognized that fabrication system 1400 may not include all of the logic shown in FIG. 14. For instance, fabrication system 1400 may not include one or more of cavity logic 1402, vessel logic 1404, and/or transducer logic 1506. Furthermore, fabrication system 1400 may include logic in addition to or in lieu of cavity logic 1402, vessel logic 1404, and/or transducer logic 1406.

Figure 15:
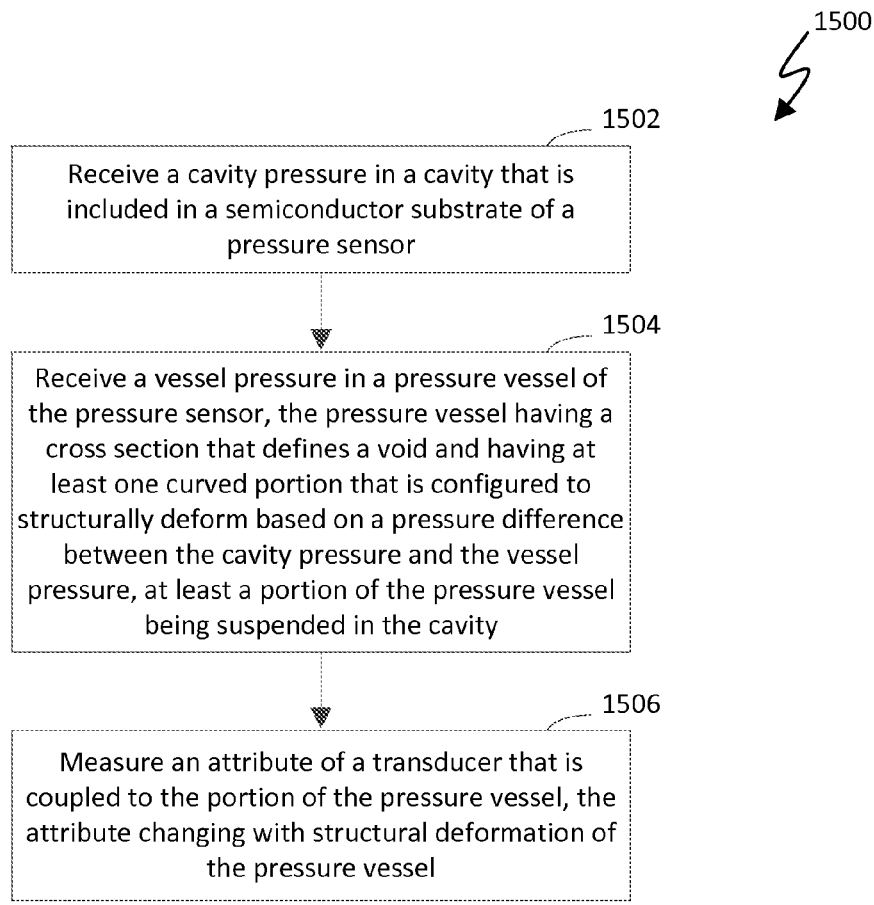
FIG. 15 depicts a flowchart of an example method for using a pressure sensor in accordance with an embodiment described herein.
Figure 16:
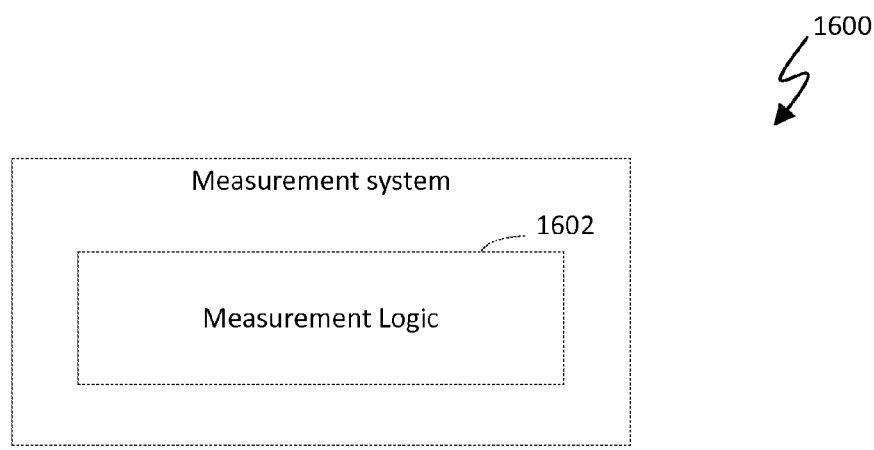
FIG. 16 is a block diagram of an example measurement system in accordance with an embodiment described herein.

FIG. 15 depicts a flowchart 1500 of an example method for using a pressure sensor in accordance with an embodiment described herein. For illustrative purposes, flowchart 1500 is described with respect to pressure sensor 500 shown in FIG. 5 and measurement system 1600 shown in FIG. 16. As shown in FIG. 16, measurement system 1600 includes measurement logic 1602. Further structural and operational embodiments will be apparent to persons skilled in the relevant art(s) based on the discussion regarding flowchart 1500.

As shown in FIG. 15, the method of flowchart 1500 begins at step 1502. In step 1502, a cavity pressure is received in a cavity that is included in a semiconductor substrate of the pressure sensor. In an example implementation, cavity 586, which is included in semiconductor substrate 580 of pressure sensor 500, receives the cavity pressure.

At step 1504, a vessel pressure is received in a pressure vessel of the pressure sensor. The pressure vessel has a cross section that defines a void. The pressure vessel has at least one curved portion that is configured to structurally deform based on a pressure difference between the cavity pressure and the vessel pressure. At least a portion of the pressure vessel is suspended in the cavity. The pressure vessel may be made from a dielectric (e.g., a dielectric lining) that is formed during processing of the semiconductor substrate, though the scope of the example embodiments is not limited in this respect. In an example implementation, pressure vessel 520 receives the vessel pressure.

At step 1506, an attribute of a transducer that is coupled to the portion of the pressure vessel is measured. The attribute changes with structural deformation of the pressure vessel. In an example implementation, measurement logic 1602 measures the attribute of transducer 503.

In an example embodiment, the transducer includes a deformable capacitive structure. In accordance with this embodiment, the attribute includes a capacitance that is associated with the capacitive structure. In further accordance with this embodiment, step 1506 includes measuring the capacitance that is associated with the capacitive structure.

In another example embodiment, the transducer includes a piezoelectric material. In accordance with this embodiment, the attribute includes a charge that is generated by the piezoelectric material. In further accordance with this embodiment, step 1506 includes measuring the charge that is generated by the piezoelectric material.

In yet another example embodiment, the transducer includes a piezoresistive material. In accordance with this embodiment, the attribute includes a resistance of the piezoresistive material. In further accordance with this embodiment, step 1506 includes measuring the resistance of the piezoresistive material.

In some example embodiments, one or more steps 1502, 1504, and/or 1506 of flowchart 1500 may not be performed. Moreover, steps in addition to or in lieu of steps 1502, 1504, and/or 1506 may be performed.

It will be recognized that measurement system 1600 may include logic in addition to or in lieu of measurement logic 1602. For instance, measurement system 1600 may include the pressure sensor or a portion thereof.

The materials described herein, their respective shapes and dimensions, and their relative positions shown in the figures are exemplary in nature and are not intended to be limiting. Modifications are contemplated, as would be apparent to persons skilled in the relevant art(s) having the benefit of this disclosure.

III. Example Computing System Implementation

Figure 17:
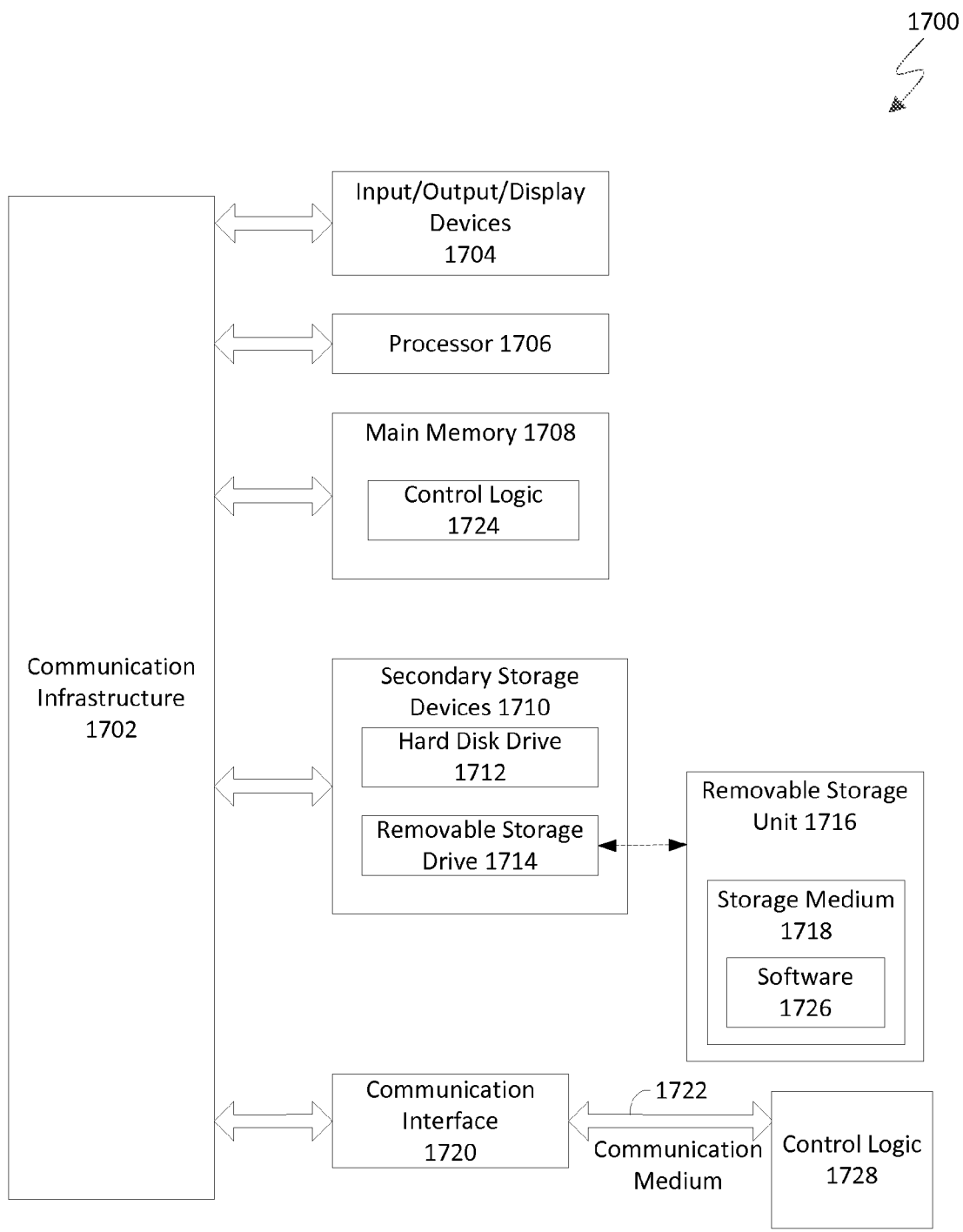
FIG. 17 is a block diagram of a computing system that may be used to implement various embodiments.

Example embodiments, systems, components, subcomponents, devices, methods, flowcharts, steps, and/or the like described herein, including but not limited to fabrication system 1400, measurement system 1600, flowcharts 1300 and 1500 may be implemented in hardware (e.g., hardware logic/electrical circuitry), or any combination of hardware with software (computer program code configured to be executed in one or more processors or processing devices) and/or firmware. The embodiments described herein, including systems, methods/processes, and/or apparatuses, may be implemented using well known computing devices, such as computer 1700 shown in FIG. 17. For example, fabrication system 1400, measurement system 1600, each of the steps of flowchart 1300, and each of the steps of flowchart 1500 may be implemented using one or more computers 1700.

Computer 1700 can be any commercially available and well known communication device, processing device, and/or computer capable of performing the functions described herein, such as devices/computers available from International Business Machines®, Apple®, HP®, Dell®, Cray®, Samsung®, Nokia®, etc. Computer 1700 may be any type of computer, including a server, a desktop computer, a laptop computer, a tablet computer, a wearable computer such as a smart watch or a head-mounted computer, a personal digital assistant, a cellular telephone, etc.

Computer 1700 includes one or more processors (also called central processing units, or CPUs), such as a processor 1706. Processor 1706 is connected to a communication infrastructure 1702, such as a communication bus. In some embodiments, processor 1706 can simultaneously operate multiple computing threads. Computer 1700 also includes a primary or main memory 1708, such as random access memory (RAM). Main memory 1708 has stored therein control logic 1724 (computer software), and data.

Computer 1700 also includes one or more secondary storage devices 1710. Secondary storage devices 1710 include, for example, a hard disk drive 1712 and/or a removable storage device or drive 1714, as well as other types of storage devices, such as memory cards and memory sticks. For instance, computer 1700 may include an industry standard interface, such a universal serial bus (USB) interface for interfacing with devices such as a memory stick. Removable storage drive 1714 represents a floppy disk drive, a magnetic tape drive, a compact disk drive, an optical storage device, tape backup, etc.

Removable storage drive 1714 interacts with a removable storage unit 1716. Removable storage unit 1716 includes a computer useable or readable storage medium 1718 having stored therein computer software 1726 (control logic) and/or data. Removable storage unit 1716 represents a floppy disk, magnetic tape, compact disk (CD), digital versatile disc (DVD), Blu-ray disc, optical storage disk, memory stick, memory card, or any other computer data storage device. Removable storage drive 1714 reads from and/or writes to removable storage unit 1716 in a well-known manner.

Computer 1700 also includes input/output/display devices 1704, such as touchscreens, LED and LCD displays, keyboards, pointing devices, etc.

Computer 1700 further includes a communication or network interface 1720.

Communication interface 1720 enables computer 1700 to communicate with remote devices. For example, communication interface 1720 allows computer 1700 to communicate over communication networks or mediums 1722 (representing a form of a computer useable or readable medium), such as local area networks (LANs), wide area networks (WANs), the Internet, etc. Network interface 1720 may interface with remote sites or networks via wired or wireless connections. Examples of communication interface 722 include but are not limited to a modem (e.g., for 3G and/or 4G communication(s)), a network interface card (e.g., an Ethernet card for Wi-Fi and/or other protocols), a communication port, a Personal Computer Memory Card International Association (PCMCIA) card, a wired or wireless USB port, etc. Control logic 1728 may be transmitted to and from computer 1700 via the communication medium 1722.

Any apparatus or manufacture comprising a computer useable or readable medium having control logic (software) stored therein is referred to herein as a computer program product or program storage device. Examples of a computer program product include but are not limited to main memory 1708, secondary storage devices 1710 (e.g., hard disk drive 1712), and removable storage unit 1716. Such computer program products, having control logic stored therein that, when executed by one or more data processing devices, cause such data processing devices to operate as described herein, represent embodiments. For example, such computer program products, when executed by processor 1706, may cause processor 1706 to perform any of the steps of flowchart 1300 of FIG. 13 and/or flowchart 1500 of FIG. 15.

Devices in which embodiments may be implemented may include storage, such as storage drives, memory devices, and further types of computer-readable media. Examples of such computer-readable storage media include a hard disk, a removable magnetic disk, a removable optical disk, flash memory cards, digital video disks, random access memories (RAMs), read only memories (ROM), and the like. As used herein, the terms "computer program medium" and "computer-readable medium" are used to generally refer to the hard disk associated with a hard disk drive, a removable magnetic disk, a removable optical disk (e.g., CD ROMs, DVD ROMs, etc.), zip disks, tapes, magnetic storage devices, optical storage devices, MEMS-based storage devices, nanotechnology-based storage devices, as well as other media such as flash memory cards, digital video discs, RAM devices, ROM devices, and the like. Such computer-readable storage media may store program modules that include computer program logic to implement, for example, embodiments, systems, components, subcomponents, devices, methods, flowcharts, steps, and/or the like described herein (as noted above), and/or further embodiments described herein. Embodiments are directed to computer program products comprising such logic (e.g., in the form of program code, instructions, or software) stored on any computer useable medium. Such program code, when executed in one or more processors, causes a device to operate as described herein.

Note that such computer-readable storage media are distinguished from and non-overlapping with communication media (do not include communication media). Communication media embodies computer-readable instructions, data structures, program modules or other data in a modulated data signal such as a carrier wave. The term "modulated data signal" means a signal that has one or more of its characteristics set or changed in such a manner as to encode information in the signal. By way of example, and not limitation, communication media includes wireless media such as acoustic, RF, infrared and other wireless media, as well as wired media. Embodiments are also directed to such communication media.

The disclosed technologies can be put into practice using software, firmware, and/or hardware implementations other than those described herein. Any software, firmware, and hardware implementations suitable for performing the functions described herein can be used.

IV. Conclusion

While various embodiments have been described above, it should be understood that they have been presented by way of example only, and not limitation. It will be apparent to persons skilled in the relevant art that various changes in form and detail can be made therein without departing from the spirit and scope of the embodiments. Thus, the breadth and scope of the embodiments should not be limited by any of the above-described exemplary embodiments, but should be defined only in accordance with the following claims and their equivalents.

What is claimed is:

1. A pressure sensor comprising:
a semiconductor substrate that includes a first cavity;
a pressure vessel made from a dielectric lining that is formed in a trench that has an aspect ratio greater than four, the pressure vessel having a cross section that defines a void, the pressure vessel having at least one curved portion that is configured to structurally deform based on a pressure difference between a cavity pressure in the first cavity and a vessel pressure in the pressure vessel, at least a first portion of the pressure vessel suspended in the first cavity; and
a first transducer coupled to the first portion of the pressure vessel, the first transducer having an attribute that changes with structural deformation of the pressure vessel.

2. The pressure sensor of claim 1, wherein the first transducer comprises:
a deformable capacitive structure configured to provide a first capacitance that changes with the structural deformation of the pressure vessel.

3. The pressure sensor of claim 2, wherein the deformable capacitive structure comprises:
a plurality of interleaved capacitor plates.

4. The pressure sensor of claim 2, wherein the deformable capacitive structure comprises:
a first set of capacitor plates interleaved with a second set of capacitor plates;
wherein the first set of capacitor plates is configured to move with respect to the second set of capacitor plates based on the structural deformation of the pressure vessel to change the first capacitance.

5. The pressure sensor of claim 4, wherein the deformable capacitive structure is further configured to provide a second capacitance that changes with the structural deformation of the pressure vessel;
wherein the deformable capacitive structure further comprises:
a third set of capacitor plates interleaved with a fourth set of capacitor plates;
wherein the third set of capacitor plates is configured to move with respect to the fourth set of capacitor plates based on the structural deformation of the pressure vessel to change the second capacitance; and
wherein the change of the first capacitance is opposite the change of the second capacitance.

6. The pressure sensor of claim 1, wherein the first transducer comprises:
a piezoelectric element configured to generate a charge based on a force that is applied to the piezoelectric element as a result of the structural deformation of the pressure vessel.

7. The pressure sensor of claim 1, wherein the first transducer comprises:
a piezoresistive element having a resistance that changes based on a force that is applied to the piezoresistive element as a result of the deformation of the pressure vessel.

8. The pressure sensor of claim 1, wherein a second portion of the pressure vessel is external to the first cavity; and
wherein at least a part of the second portion is removed to provide a vessel pressure port that exposes a first environment in the pressure vessel to a second environment that is external to the pressure vessel.

9. The pressure sensor of claim 1, wherein a second portion of the pressure vessel is external to the first cavity;
wherein the semiconductor substrate includes a second cavity that is external to the first cavity;
wherein at least a part of the second portion of the pressure vessel is included in the second cavity; and
wherein the part of the second portion has an opening that exposes a first environment in the pressure vessel to a second environment in the second cavity.

10. The pressure sensor of claim 9, further comprising:
a lid that includes a hole to provide a vessel pressure port that exposes the first environment and the second environment to a third environment that is external to the pressure sensor.

11. The pressure sensor of claim 1, wherein a surrounding rectangle is defined as a rectangle having a smallest area that surrounds the first cavity in a plane of a wafer from which the pressure sensor is fabricated, the surrounding rectangle having first parallel sides and second parallel sides that are perpendicular the first parallel sides, each first parallel side having a first length, each second parallel side having a second length that is less than or equal to the first length; and
wherein a distance between a first point at which the pressure vessel couples to the substrate and a second point at which the first transducer couples to the substrate is less than or equal to one-third of the second length.

12. The pressure sensor of claim 1, wherein a surrounding rectangle is defined as a rectangle having a smallest area that surrounds the first cavity in a plane of a wafer from which the pressure sensor is fabricated, the surrounding rectangle having first parallel sides and second parallel sides that are perpendicular the first parallel sides, each first parallel side having a first length, each second parallel side having a second length that is less than or equal to the first length; and wherein a distance between a first point at which the pressure vessel couples to the substrate and a second point at which the pressure vessel couples to the first transducer is less than or equal to one-third of the second length.

13. The pressure sensor of claim 1, wherein a surrounding rectangle is defined as a rectangle having a smallest area that surrounds the first cavity in a plane of a wafer from which the pressure sensor is fabricated, the surrounding rectangle having first parallel sides and second parallel sides that are perpendicular the first parallel sides, each first parallel side having a first length, each second parallel side having a second length that is less than or equal to the first length; and wherein a distance between a first point at which the first transducer couples to the pressure vessel and a second point at which the first transducer couples to the substrate is less than or equal to one-third of the second length.

14. The pressure sensor of claim 1, wherein a maximum width of the void is less than or equal to two microns.

15. The pressure sensor of claim 1, wherein the at least one curved portion of the pressure vessel includes at least one serpentine portion having a serpentine shape.

16. The pressure sensor of claim 1, wherein the at least one curved portion of the pressure vessel includes at least one spiral portion having a spiral shape.

17. The pressure sensor of claim 1, wherein the at least one curved portion of the pressure vessel includes at least one semicircular portion having a semicircular shape.

18. The pressure sensor of claim 1, wherein the at least one curved portion of the pressure vessel includes a plurality of concentric semicircular portions, each semicircular portion having a semicircular shape.

19. The pressure sensor of claim 1, further comprising:

a connector coupled to the pressure vessel at a first connection point and coupled to the first transducer at a second connection point;

wherein the first connection point has a first motion resulting from the deformation of the pressure vessel; and wherein the connector is configured to cause the second connection point to have a second motion, which is an amplified version of the first motion.

20. The pressure sensor of claim 1, further comprising:

a connector coupled to the pressure vessel at a first connection point and coupled to the first transducer at a second connection point;

wherein the first connection point has a first motion resulting from the deformation of the pressure vessel; and wherein the connector is configured to cause the second connection point to have a second motion, which is a de-amplified version of the first motion.

21. The pressure sensor of claim 1, further comprising:

a connector coupled between the pressure vessel and the first transducer, the connector having an anisotropic stiffness.

22. The pressure sensor of claim 1, further comprising:

a second pressure vessel having a cross section that defines a second void, the second pressure vessel having at least one curved portion that is configured to structurally deform based on a pressure difference between a cavity pressure in a second cavity that is included in the semiconductor substrate and a vessel pressure in the second pressure vessel, at least a first portion of the second pressure vessel suspended in the second cavity; and a second transducer coupled to the first portion of the second pressure vessel, the second transducer having an attribute that changes with structural deformation of the second pressure vessel;

wherein the first transducer is configured to provide a first signal based on a change of the attribute of the first transducer that results from at least one of an acceleration of the pressure vessel or the pressure difference between the cavity pressure in the first cavity and the vessel pressure in the first pressure vessel; and wherein the second transducer is configured to provide a second signal based on a change of the attribute of the second transducer that results from at least one of the acceleration of the pressure vessel or the pressure difference between the cavity pressure in the second cavity and the vessel pressure in the second pressure vessel.

23. The pressure sensor of claim 22, wherein the pressure sensor is configured such that a difference between the first signal and the second signal provides a measure of the acceleration of the pressure sensor and such that a sum of the first signal and the second signal provides a measure of a pressure difference.

24. The pressure sensor of claim 22, wherein the pressure sensor is configured such that a sum of the first signal and the second signal provides a measure of the acceleration of the pressure sensor and such that a difference between the first signal and the second signal provides a measure of a pressure difference.

25. The pressure sensor of claim 22, wherein the first cavity and the second cavity are same.

26. A method comprising:

providing a semiconductor substrate that includes a cavity;

fabricating a pressure vessel from a dielectric lining that is formed in a trench that has an aspect ratio greater than four, the pressure vessel having a cross section that defines a void, the pressure vessel having at least one curved portion that is configured to structurally deform based on a pressure difference between a cavity pressure in the cavity and a vessel pressure in the pressure vessel, at least a portion of the pressure vessel suspended in the cavity; and fabricating a transducer coupled to the portion of the pressure vessel, the transducer having an attribute that changes with structural deformation of the pressure vessel.

27. A method comprising:

receiving a cavity pressure in a cavity that is included in a semiconductor substrate of a pressure sensor;

receiving a vessel pressure in a pressure vessel of the pressure sensor that is made from a dielectric lining that is formed in a trench that has an aspect ratio greater than four, the pressure vessel having a cross section that defines a void and having at least one curved portion that is configured to structurally deform based on a pressure difference between the cavity pressure and the vessel pressure, at least a portion of the pressure vessel being suspended in the cavity; and measuring an attribute of a transducer that is coupled to the portion of the pressure vessel, the attribute changing with structural deformation of the pressure vessel.

* * * * *